(12) United States Patent
Sawahata

(10) Patent No.: US 8,030,683 B2
(45) Date of Patent: Oct. 4, 2011

(54) PROTECTION CIRCUIT

(75) Inventor: Kouichi Sawahata, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 371 days.

(21) Appl. No.: 12/411,611

(22) Filed: Mar. 26, 2009

(65) Prior Publication Data

US 2009/0244797 A1 Oct. 1, 2009

(30) Foreign Application Priority Data

Mar. 27, 2008 (JP) ................................. 2008-083734

(51) Int. Cl.
*H01L 29/66* (2006.01)
(52) U.S. Cl. ................................. 257/173; 257/E29.225
(58) Field of Classification Search .......... 257/107–182, 257/213, 288, 355–363, E29.001, E29.166, 257/E29.169, E29.171, E29.211, E29.225
See application file for complete search history.

(56) References Cited

U.S. PATENT DOCUMENTS

2003/0168701 A1* 9/2003 Voldman ........................ 257/355

FOREIGN PATENT DOCUMENTS

| JP | 2000-277700 | 10/2000 |
| JP | 2005-101485 | 4/2005 |

OTHER PUBLICATIONS

Brennan et al., "Implementation of Diode and Bipolar Triggered SCRs for CDM Robust ESD protection in 90mm CMOS ASICs", 2005 EOS/ESD Symposium.

* cited by examiner

*Primary Examiner* — Ha Tran T Nguyen
*Assistant Examiner* — Kevin Quinto
(74) *Attorney, Agent, or Firm* — Young & Thompson

(57) ABSTRACT

A protection circuit according to an embodiment of the present invention is provided between a first terminal and a second terminal and includes: a capacitor element having one end connected to the second terminal; and a multi-cathode thyristor formed on a semiconductor substrate, and including an anode connected to the first terminal, a first cathode connected to the second terminal, and a second cathode disposed between the anode and the first cathode and connected to another terminal of the capacitor element.

11 Claims, 30 Drawing Sheets

PROTECTION CIRCUIT

BACKGROUND

1. Field of the Invention

The present invention relates to a protection circuit. In particular, the present invention relates to a protection circuit including a thyristor formed on a semiconductor substrate, and to a protection circuit provided between a first terminal and a second terminal to provide protection against an overvoltage and an overcurrent caused by electrostatic discharge (ESD) or the like.

2. Description of Related Art

Up to now, in the field of semiconductor integrated circuit, various types of protection circuits including a diode, a MOS transistor, or the like are used to prevent an input/output terminal and a power supply terminal from being destroyed by static electricity. In particular, with the recent trend toward miniaturization and higher integration of semiconductor integrated circuits, semiconductor devices are more easily destroyed by static electricity. For this reason, the importance of protection circuits against static electricity has been increasing, and the research and development on protection circuits has been vigorously conducted by various manufacturers. Of the protection circuits, a thyristor (SCR) type protection circuit has been attracting attention recently, because of its excellent discharge capacity.

For example, Japanese Unexamined Patent Application Publication No. 2005-101485 (see FIG. 24) filed by the present inventor discloses a thyristor-type protection circuit in which a trigger element is connected between an N-well tap and a P-well tap so as to trigger a PNP transistor and an NPN transistor, which constitute a thyristor, at substantially the same time, thereby rapidly providing protection against static electricity FIG. 28 shows a circuit diagram of the protection circuit, and FIG. 29 is a cross-sectional view showing the configuration of the protection circuit.

Further, "Implementation of Diode and Bipolar triggered SCRs for CDM Robust ESD protection in 90 nm CMOS ASICs"; IBM, 2005 EOS/ESD Symposium (Ciaran J Brennan, Shunhua Chang, Min Woo, Kiran Chatty, Robert Gauthier) discloses a thyristor-type electrostatic protection circuit in which a dual base Darlington bipolar transistor is used as a trigger element in a CMOS device having a triple well structure so as to operate at high speed. FIG. 30 is a cross-sectional view showing the configuration of the circuit.

Furthermore, Japanese Unexamined Patent Application Publication No. 2000-277700 (see FIG. 6B) (Men Wan Riu et al.) discloses a circuit in which a primary protection device incorporating a thyristor and a secondary protection device incorporating an NMOS transistor are used in combination, and sources of the primary protection device and the secondary protection device are used in common so as to lower a trigger voltage for the primary protection device to a voltage close to a trigger voltage for the secondary protection device, to thereby effectively attain the protection. FIG. 31 is a cross-sectional view showing the configuration of the circuit.

SUMMARY

As described above, the thyristor-type electrostatic protection circuit is advantageous in that the discharge capacity is high. However, the present inventor has found a problem that it is difficult for the thyristor-type electrostatic protection circuit to be rapidly triggered when static electricity is applied, and to prevent a latch-up from occurring in a normal use state, at the same time. In other words, the latch-up phenomenon corresponds to a thyristor operation, and if the thyristor operation is caused to easily occur when static electricity is applied, the latch-up is more likely to occur even in a normal use state.

For example, even if a parasitic bipolar operation of an NMOS transistor is employed for the secondary protection device as disclosed in Men Wan Riu et al., carriers in the bipolar operation are only electrons, and the protection performance is insufficient compared to the thyristor. Moreover, when a MOS transistor is used for the protection circuit, there is a fear that a gate oxide film is damaged.

Therefore, there is a demand for a thyristor-type protection circuit which is rapidly triggered without damaging the protection circuit itself when static electricity is applied, and which hardly causes a latch-up during normal use.

The present invention discloses herein may involve the following exemplary aspects.

A first exemplary aspect of an embodiment of the present invention is a protection circuit provided between a first terminal and a second terminal and including: a capacitor element having one end connected to the second terminal; and a multi-cathode thyristor formed on a semiconductor substrate, and including an anode connected to the first terminal, a first cathode connected to the second terminal, and a second cathode disposed between the anode and the first cathode and connected to another terminal of the capacitor element.

A second exemplary aspect of an embodiment of the present invention is a protection circuit provided between a first terminal and a second terminal and including: a capacitor element having one end connected to the second terminal; and a multi-cathode thyristor formed on a semiconductor substrate, and including an anode connected to the first terminal, a first cathode connected to the second terminal, and a second cathode connected to another end of the capacitor element, in which the second cathode is disposed at a position where the second cathode causes a thyristor operation more easily than the first cathode and the thyristor operation between the first cathode and the anode is induced when the thyristor operation is started.

A third exemplary aspect of an embodiment of the present invention is the protection circuit in which the multi-cathode thyristor is replaced with a multi-anode thyristor with the anode replaced with a cathode, the first cathode replaced with a first anode, and the second cathode replaced with a second anode.

A fourth exemplary aspect of an embodiment of the present invention is a protection circuit provided between a first terminal and a second terminal and including: a capacitor element having one end connected to the second terminal; and a thyristor formed on a semiconductor substrate and including: a first-conductivity-type low-concentration region; a second-conductivity-type low-concentration region formed to be adjacent to the first-conductivity-type low-concentration region; a first-conductivity-type high-concentration region formed in the second-conductivity-type low-concentration region and connected to the first terminal; a first second-conductivity-type high-concentration region formed in the first-conductivity-type low-concentration region and connected to the second terminal; and a second second-conductivity-type high-concentration region sandwiched between the first-conductivity-type high-concentration region and the first second-conductivity-type high-concentration region, formed in the first-conductivity-type low-concentration region, and connected to another end of the capacitor element.

According to an exemplary embodiment of the present invention, it is possible to provide a thyristor-type protection circuit that is more easily triggered and hardly causes a latch-up.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
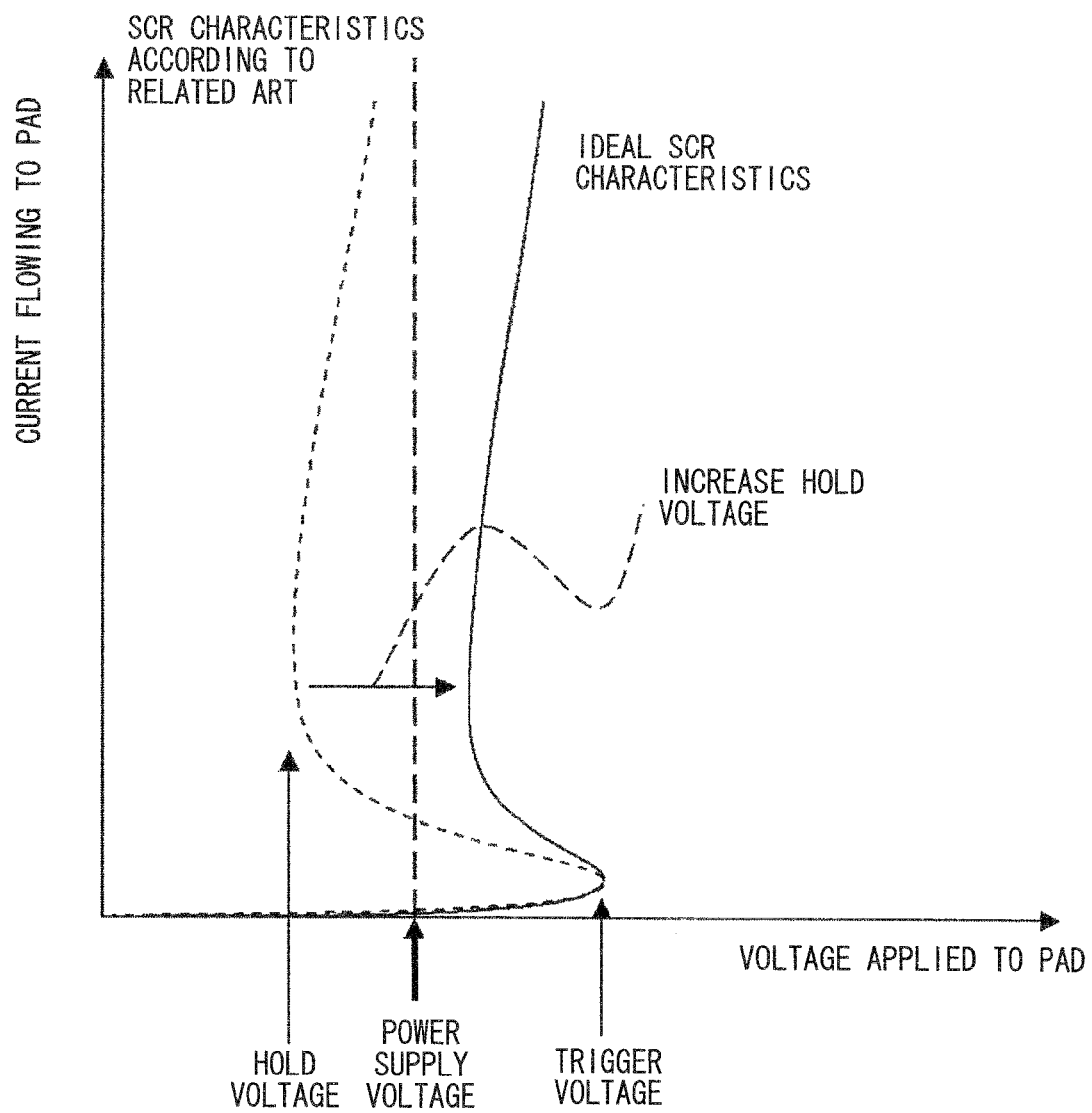
FIG. 1 is a graph showing a comparison of voltage-current characteristics between a thyristor-type protection circuit according to a related art and an ideal thyristor-type protection circuit.

Before describing exemplary embodiments of the present invention in detail, the characteristics required for a thyristor-type protection circuit will be described, for better understanding of the exemplary embodiments of the present invention. FIG. 1 is a graph showing a comparison of voltage-current characteristics obtained when a thyristor-type protection circuit according to a related art and an ideal thyristor-type protection circuit are used to protect power supply terminals. In FIG. 1, an axis of abscissa indicates a voltage between the power supply terminals, and an axis of ordinate indicates a current flowing through the protection circuits. The dashed curve of FIG. 1 indicates the voltage-current characteristics of the thyristor-type protection circuit according to the related art, and the solid line of FIG. 1 indicates the voltage-current characteristics of the ideal thyristor protection circuit.

First, consideration is given to a case where a protection circuit for use in protecting power supply terminals of an integrated circuit functions as a static electricity protection circuit. Before static electricity is applied between the power supply terminals, there is no potential difference between the power supply terminals. When static electricity is applied between the power supply terminals, a voltage applied between the power supply terminals rapidly rises. Further, when the voltage between the terminals reaches a trigger voltage, the protection circuit starts a thyristor operation. When the thyristor operation is started, a current starts to flow between the power supply terminals and the voltage applied between the power supply terminals drops to a holding voltage, and then a large current is discharged. Thus, the circuit functions as the protection circuit. The protection circuit is required to rapidly trigger the thyristor, that is, to easily trigger the thyristor.

Next, consideration is given to a case where the latch-up is caused when the same protection circuits are in an ordinary use state. A power supply voltage shown in FIG. 1 is a possible maximum power supply voltage obtained during the ordinary use state. Though a voltage at which the thyristor is triggered is higher than the maximum power supply voltage, the thyristor is triggered when a voltage between the power supply terminals reaches a trigger voltage due to power supply noise or the like. It is necessary for the thyristor to be triggered in order to protect the integrated circuit against the power-supply noise due to lightning or the like. In this case, once the thyristor is triggered, the thyristor operation is not released as long as the power supply voltage is higher than a holding voltage for holding the thyristor operation, which is a so-called latch-up state. The latch-up state is not released unless the power supply voltage is reduced to be lower than the holding voltage.

In the case where the holding voltage for holding the thyristor operation is higher than the maximum power supply voltage, however, even if the thyristor operation occurs only when the power-supply noise is received, the thyristor operation is released as long as the power supply noise disappears and the power supply voltage returns to its original voltage level, since the power supply voltage is lower than the holding voltage for holding the thyristor operation. That is, in order to prevent a latch-up from occurring, the holding voltage for holding the thyristor operation is required to be greater than a possible maximum potential difference between the terminals to be protected by the protection circuit in the ordinary use state.

Exemplary embodiments of the present invention will be described in detail below by way of example, based on the characteristics required for the thyristor-type protection circuit.

First Exemplary Embodiment

Figure 2:
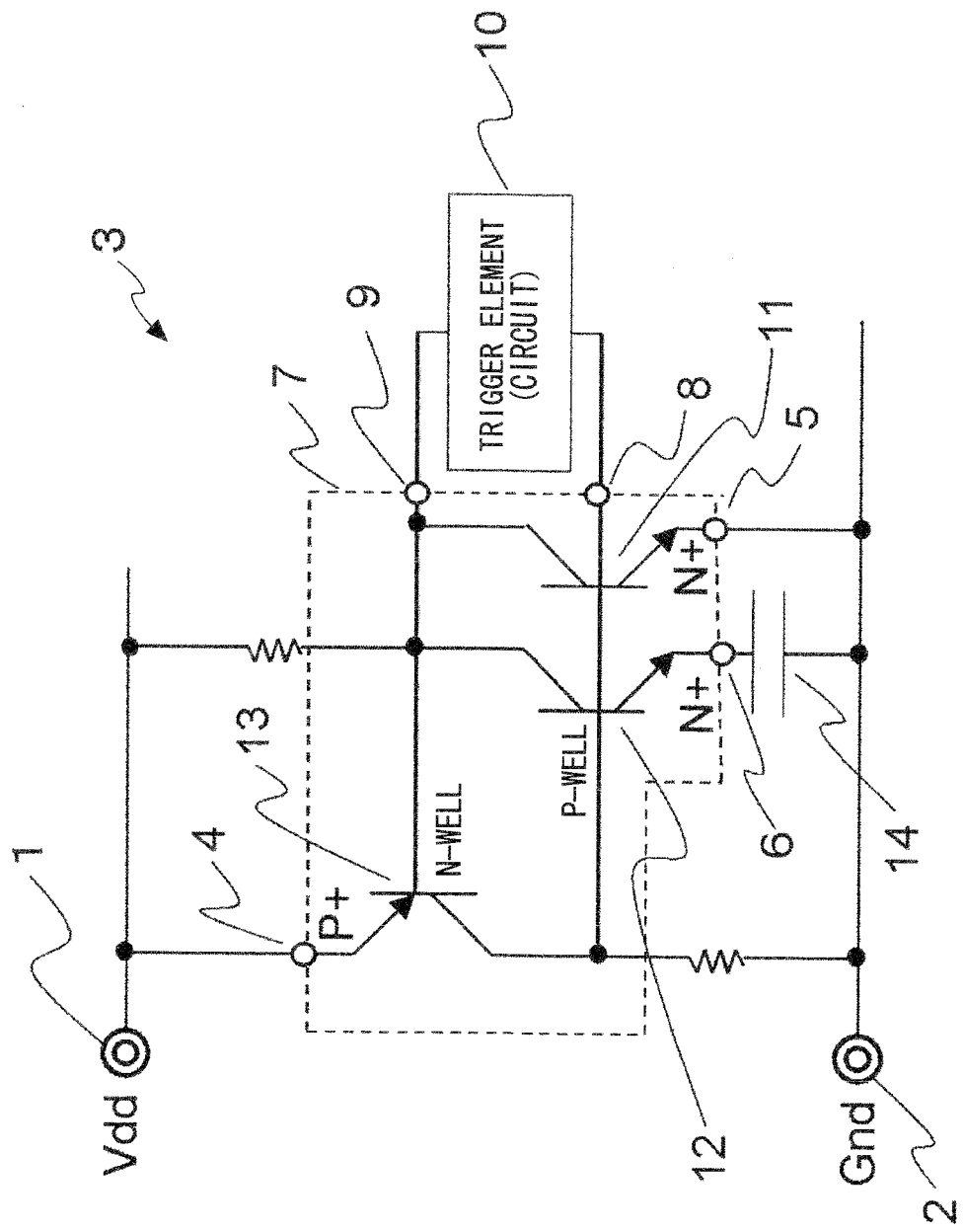
FIG. 2 is a circuit diagram showing a circuit according to a first exemplary embodiment of the present invention.
Figure 3:
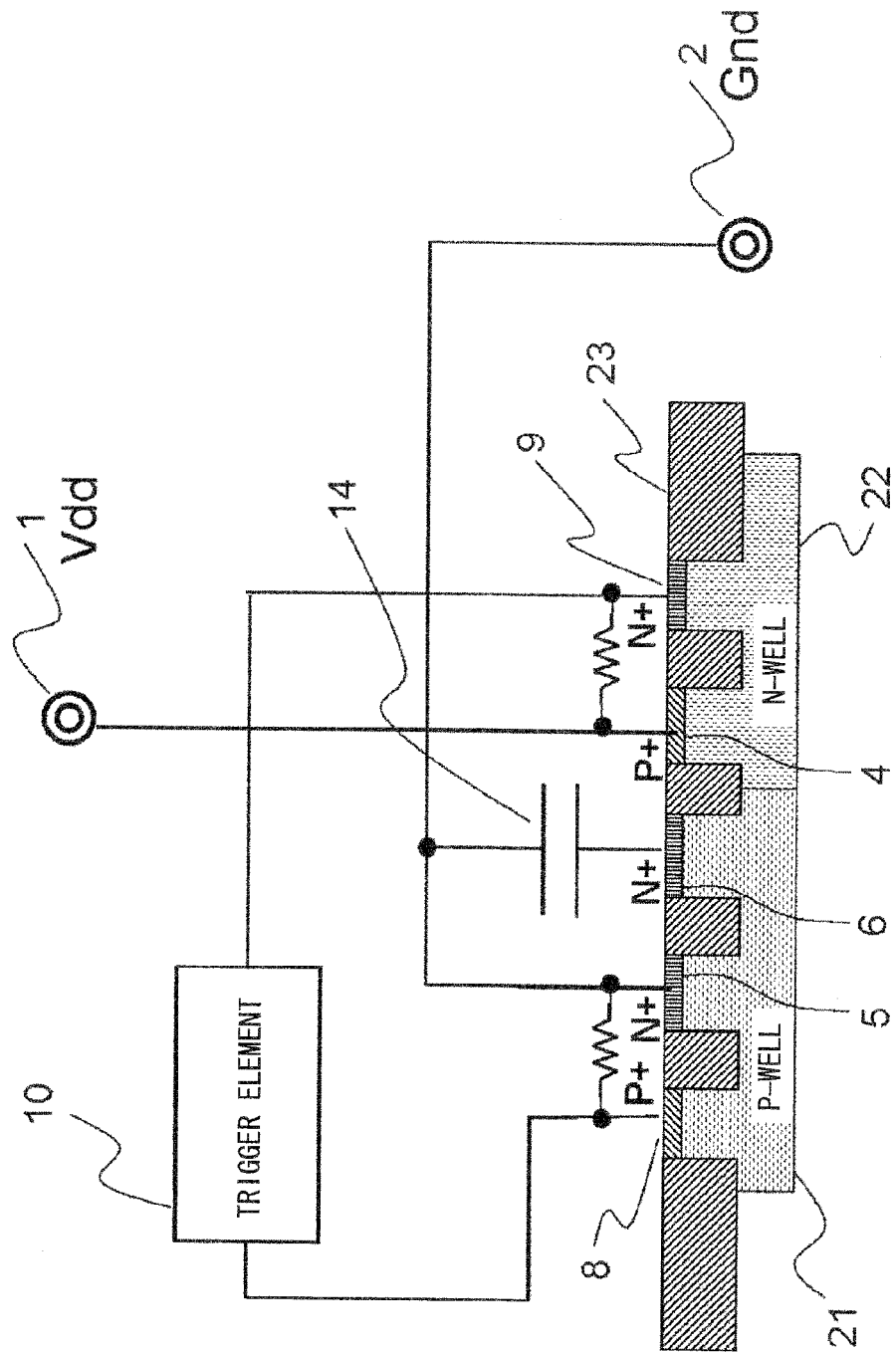
FIG. 3 is a cross-sectional view showing a multi-cathode thyristor according to a first exemplary embodiment of the present invention.
Figure 4:
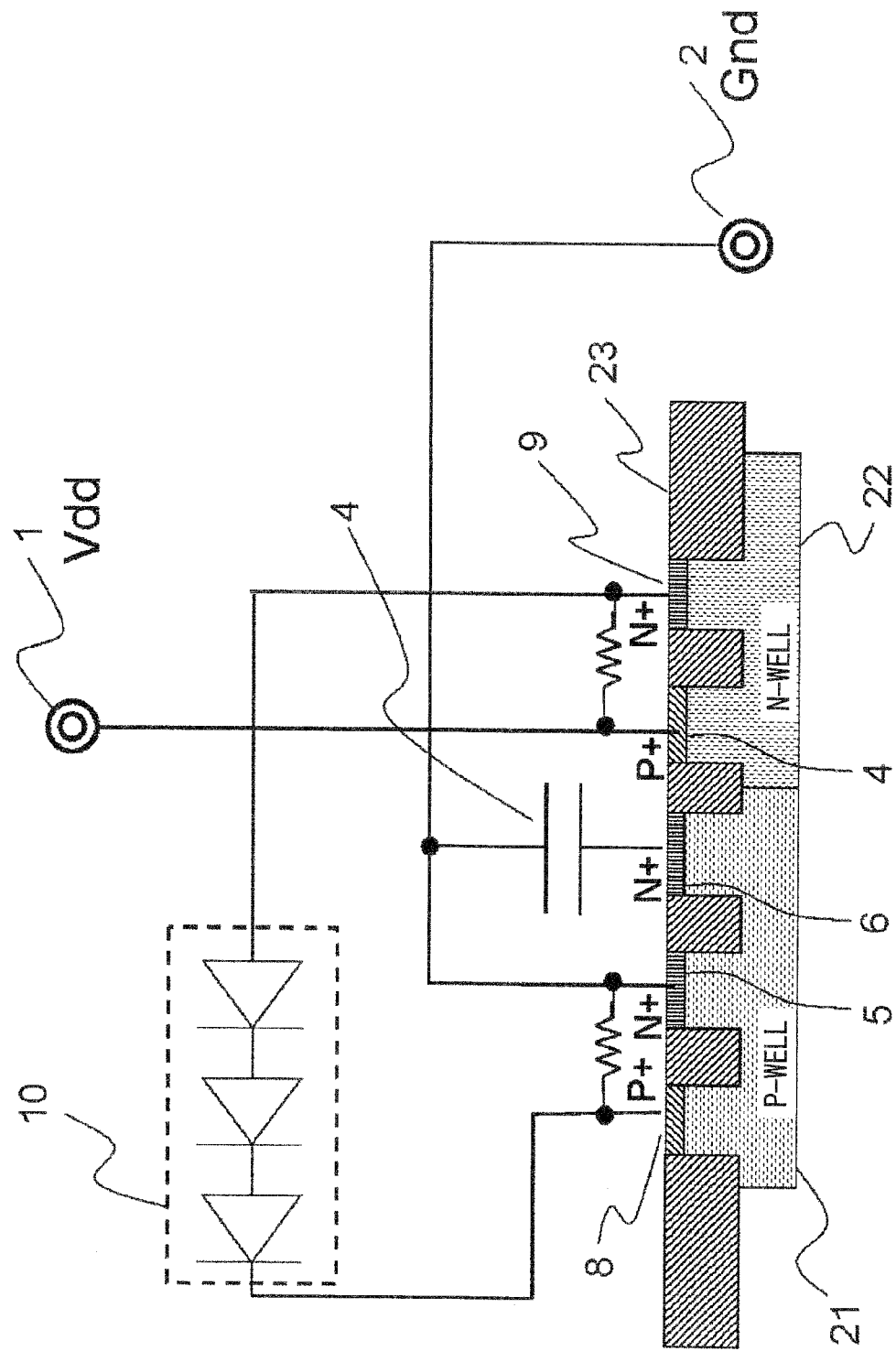
FIG. 4 shows an example of an internal circuit of a trigger element which is added to the cross-sectional view of FIG. 3.
Figure 5:
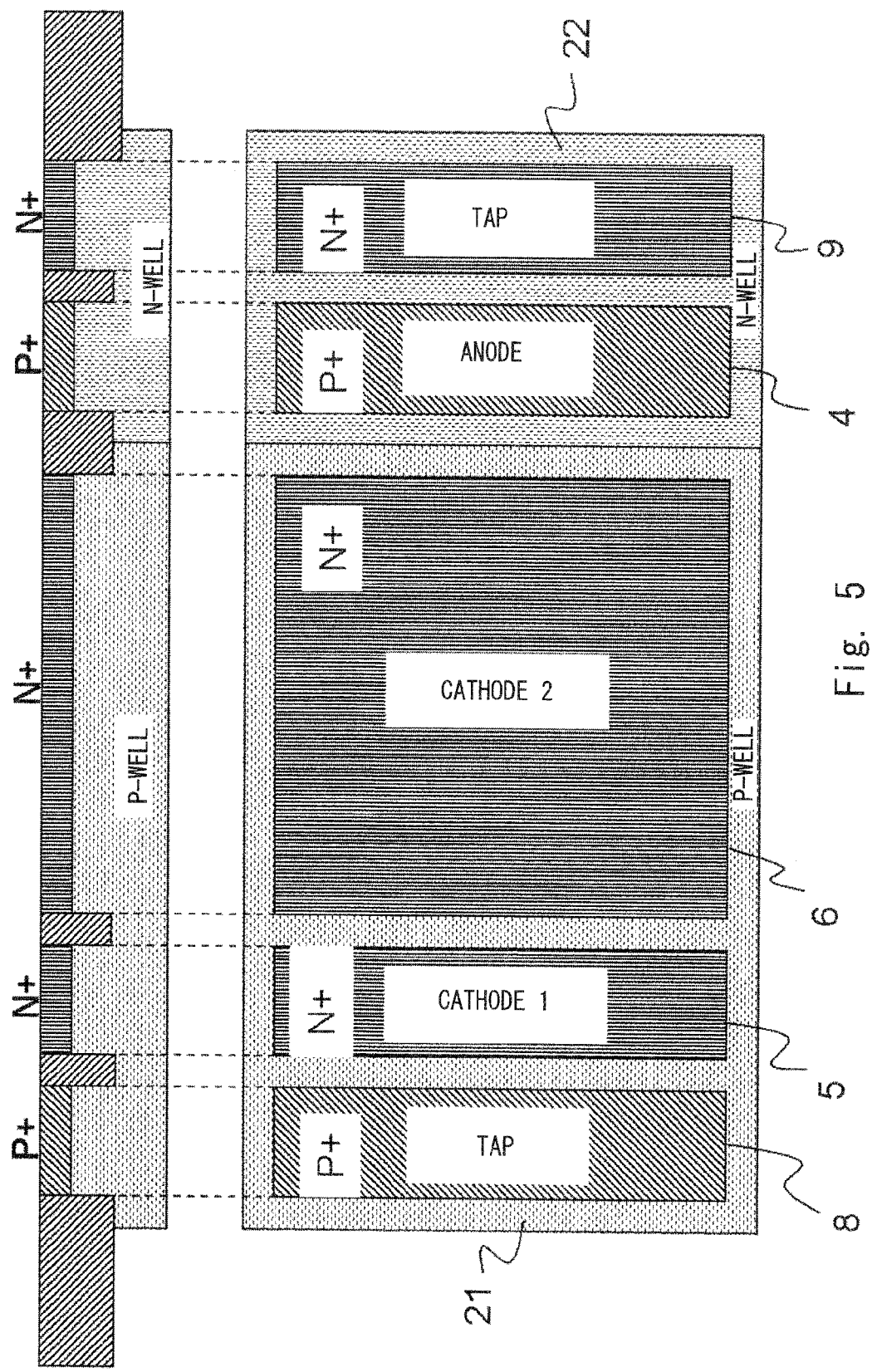
FIG. 5 is a plan view of a multi-cathode thyristor according to a first exemplary embodiment of the present invention.

A first exemplary embodiment of the present invention shows an example in which a protection circuit is used to protect power supply terminals. FIG. 2 is a circuit diagram showing the protection circuit according to the first exemplary embodiment. FIG. 3 is a cross-sectional view showing a multi-cathode thyristor for use in the protection circuit shown in FIG. 2. FIG. 4 shows an example of an internal circuit of a trigger element 10 which is added to the cross-sectional view of FIG. 3, for facilitating the understanding of circuit operation. FIG. 5 is a plan view of the multi-cathode thyristor according to the first exemplary embodiment.

First, the configuration of the circuit according to the first exemplary embodiment will be described with reference to FIG. 2. A thyristor-type protection circuit 3 is provided between a first power supply VDD terminal 1 and a second power supply GND terminal 2. The protection circuit 3 includes a capacitor element 14, a multi-cathode thyristor 7, and the trigger element 10. The multi-cathode thyristor 7 has an anode 4 connected to the first power supply VDD terminal 1, a first cathode 5 connected to the second power supply GND terminal 2, and a second cathode 6 connected to the second power supply GND terminal 2 through the capacitor element 14.

The multi-cathode thyristor 7 includes NPN transistors 11 and 12 having their collectors and bases connected in common, and a PNP transistor 13 having a base connected to each of the collectors of the NPN transistors 11 and 12 and having an emitter connected to each of the bases of the NPN transistors 11 and 12. The emitter of the PNP transistor 13 serves as the anode 4, and emitters of the NPN transistors 11 and 12 serve as the first cathode 5 and the second cathode 6, respectively.

Further, the trigger element 10 is connected between an N-type trigger tap 9 serving as the base of the PNP transistor 13 and a P-type trigger tap 8 serving as the base of each of the NPN transistors 11 and 12.

Next, a description is given of a configuration in which the multi-cathode thyristor 7 that is formed on a semiconductor substrate, with reference to the cross-sectional view of FIG. 3 and the plan view of FIG. 5. Referring to FIGS. 3 and 5, a P-well 21 and an N-well 22 are formed to be adjacent to be each other on the semiconductor substrate, and a P-type high concentration region serving as the anode 4 is formed on the surface of the N-well 22. Further, an N-type high concentration region serving as the N-type trigger tap 9 is formed on the surface of the N-well 22, and is connected to one terminal of the trigger element 10. Furthermore, N-type high concentration regions serving as the first cathode and the second cathode 6, and a P-type high concentration region serving as the P-type trigger tap 8 are formed on the surface of the P-well 21, and are connected to the other terminal of the trigger element 10. Note that the trigger element may be formed of a plurality of diodes connected in series with each other in the forward direction as shown in FIG. 4. Further, the capacitor element 14 may be formed on the semiconductor substrate by a known method.

In this case, since the second cathode 6 is disposed near the anode 4, the P-well 21 and the N-well 22 have a sufficiently low resistance between the anode 4 and the second cathode 6, which allows the anode 4 and the second cathode 6 to be triggered rapidly and causes the thyristor operation to easily occur. Furthers the value of the holding voltage for holding the thyristor operation is extremely small. Meanwhile, since the second anode 6 is connected to the second power supply GND terminal 2 through the capacitor element 14, when all the electric charges accumulated in the capacitor element 14 are discharged, the thyristor operation occurring between the anode 4 and the second cathode 6 is stopped.

Further, the first cathode 5 is spaced apart from the anode 4 with the second cathode 6 interposed therebetween. Accordingly, considering the thyristor operation between the first cathode 5 and the anode 4 alone, the thyristor operation hardly occurs between the first cathode 5 and the anode 4, since the resistance value of the P-well 21 is large. Even when the thyristor operation is started, the holding voltage rises. However, since the second cathode 6 is disposed between the first cathode 5 and the anode 4, when the thyristor operation between the second cathode 6 and the anode 4 is started, a sufficient quantity of holes and electrons are injected into the P-well 21 formed below the second cathode 6, which corresponds to a low-resistance state. Accordingly, it is not necessary for the first cathode 5 to inject carriers into a portion below the second cathode 6, and the time for starting the thyristor operation is shortened, which causes the thyristor operation to easily occur. Thus, when the second cathode 6 connected to the capacitor element 14 is formed between the first cathode 5 and the anode 4, the thyristor operation can be quickly started between the first cathode 5 and the anode 4, and an electrostatic breakdown is prevented from occurring. Moreover, a distance between the first cathode 5 and the anode 4 can be increased, and thus the holding voltage for holding the thyristor operation can be increased and the latch-up can be prevented from occurring.

Second Exemplary Embodiment

Figure 6:
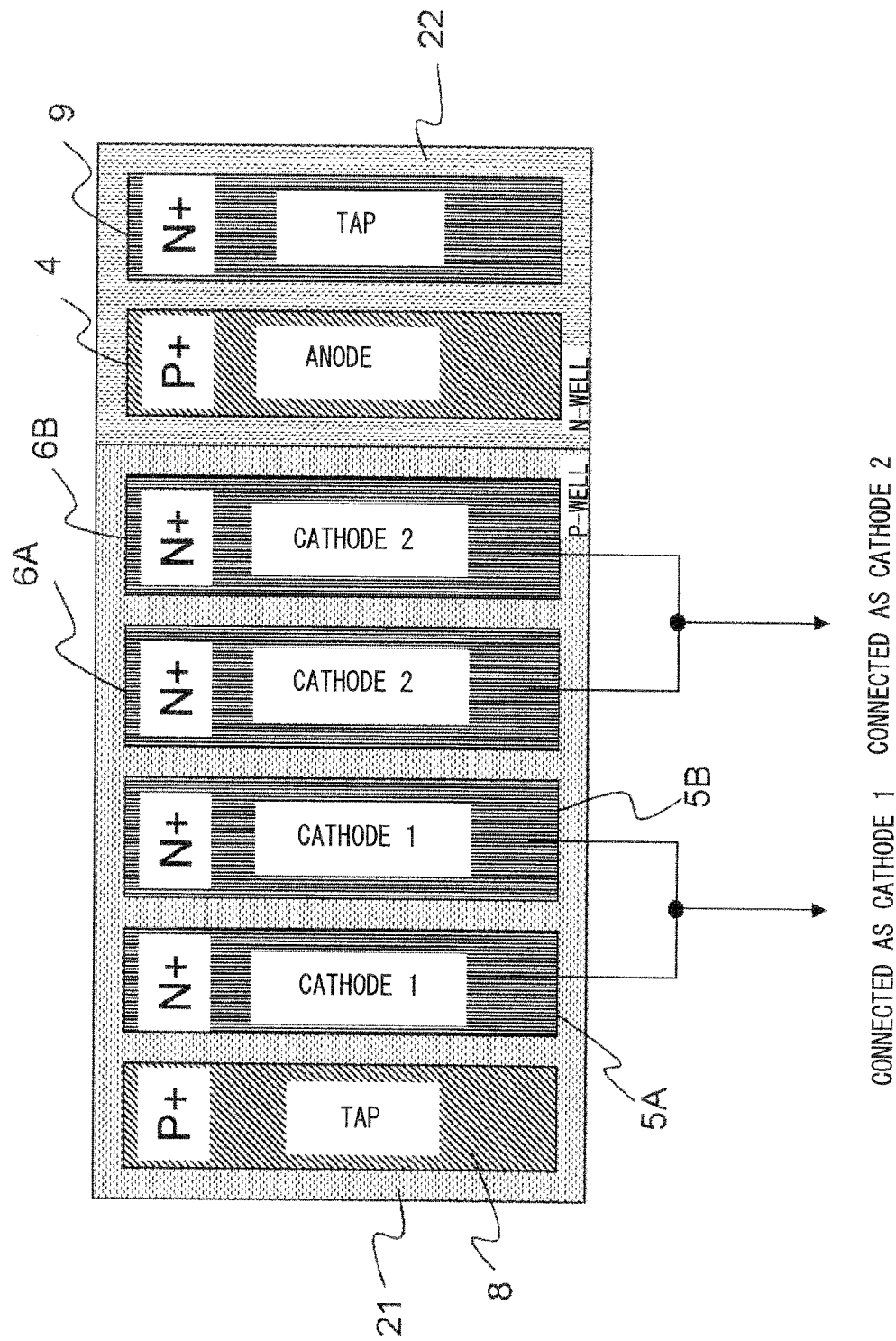
FIG. 6 is a plan view of a multi-cathode thyristor according to a second exemplary embodiment of the present invention.

Next, a second exemplary embodiment of the present invention will be described with reference to the drawings. FIG. 6 is a plan view of a multi-cathode thyristor according to the second exemplary embodiment that is disposed on a semiconductor substrate. While the cathode region is divided into two regions in the first exemplary embodiment, the cathode region is divided into four regions in the second exemplary embodiment. Further, according to the second exemplary embodiment, three cathode regions 5B 6A and 6B are sandwiched between the anode 4 and the cathode region 5A that is farthest from the anode 4 among the four cathodes regions. The optimum positional relationship among the anode 4 and the first and second cathodes may vary depending on the process change or the like. When the cathode regions are formed in the manner as in the second exemplary embodiment, the relative position and size of each of the first and second cathodes with respect to the anode 4 can be changed by changing only a wiring process. Accordingly, the time for starting the thyristor operation and the holding voltage can be easily adjusted. In other words, multiple cathodes are disposed between the anode and the cathode that is farthest from the anode, and it is determined which of the cathode is connected as the first cathode or which of the cathode is connected as the second cathode, that is, the connection between the cathodes is changed in an assembly and testing process such as the wiring process. As a result, it is possible to provide a protection circuit having optimum characteristics that meet the specifications required by a customer, manufacturing conditions, and the like.

Third Exemplary Embodiment

Figure 7:
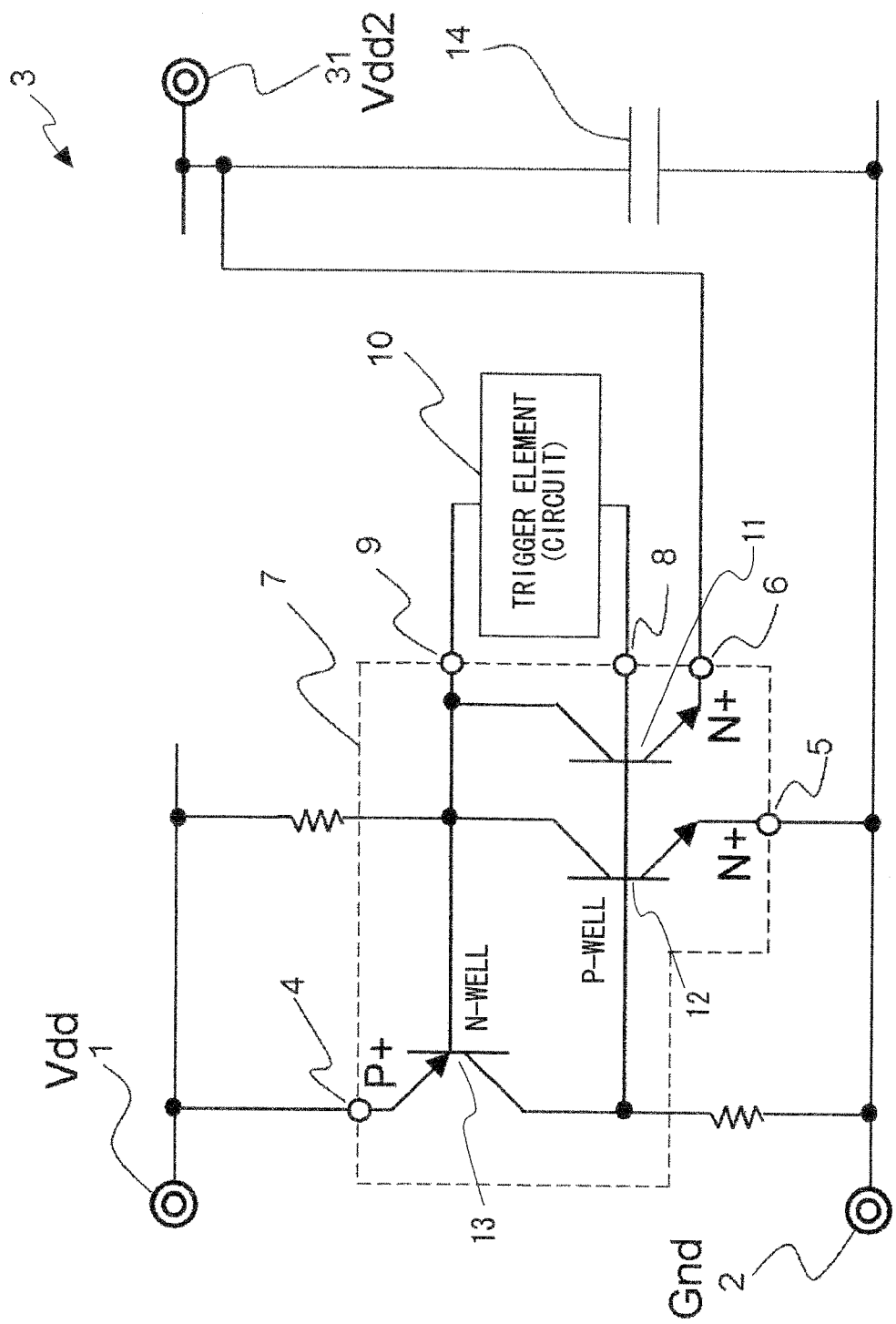
FIG. 7 is a circuit diagram showing a circuit according to a third exemplary embodiment of the present invention.
Figure 8:
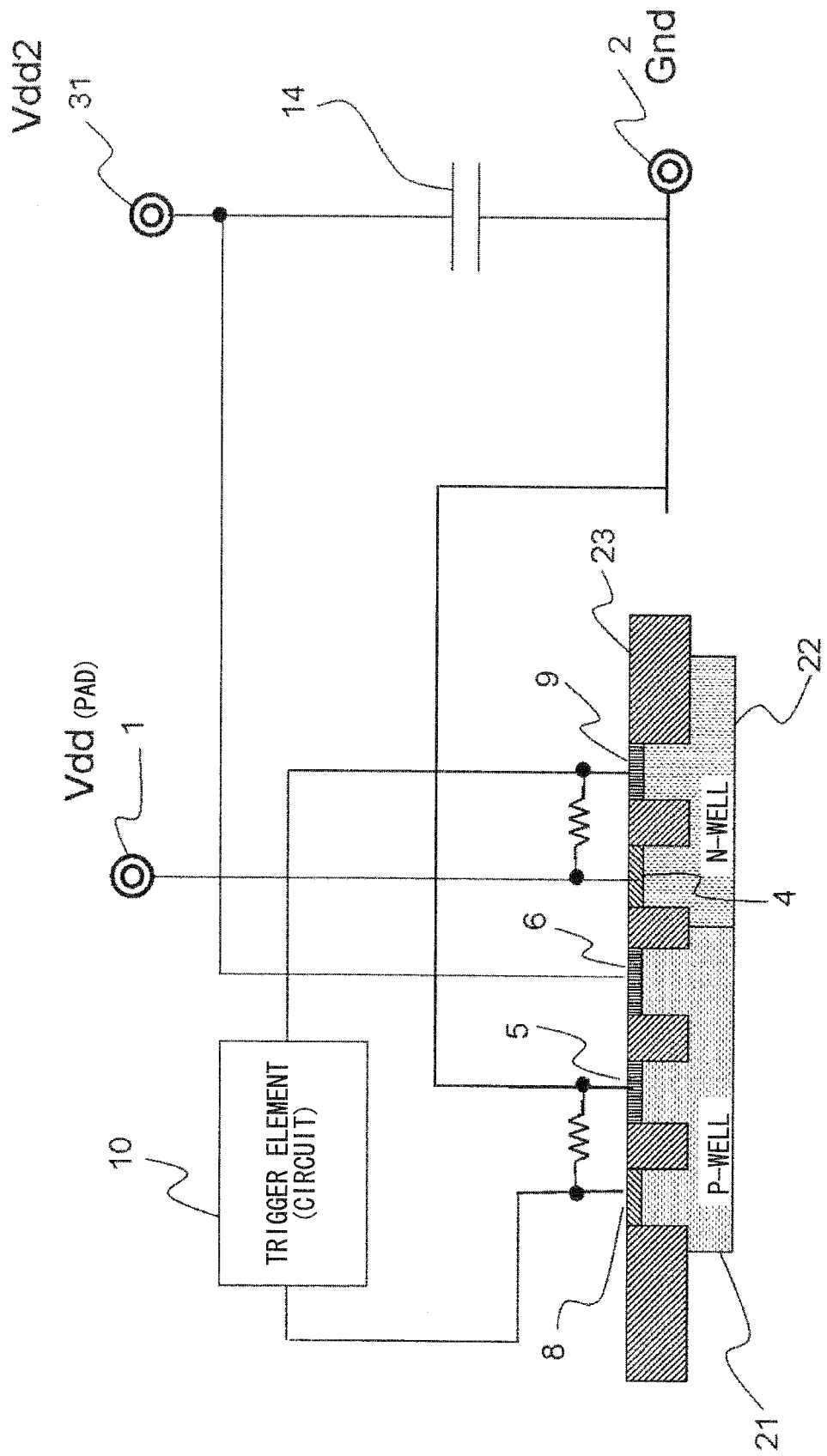
FIG. 8 is a cross-sectional view showing a multi-cathode thyristor according to the third exemplary embodiment of the present invention.
Figure 9:
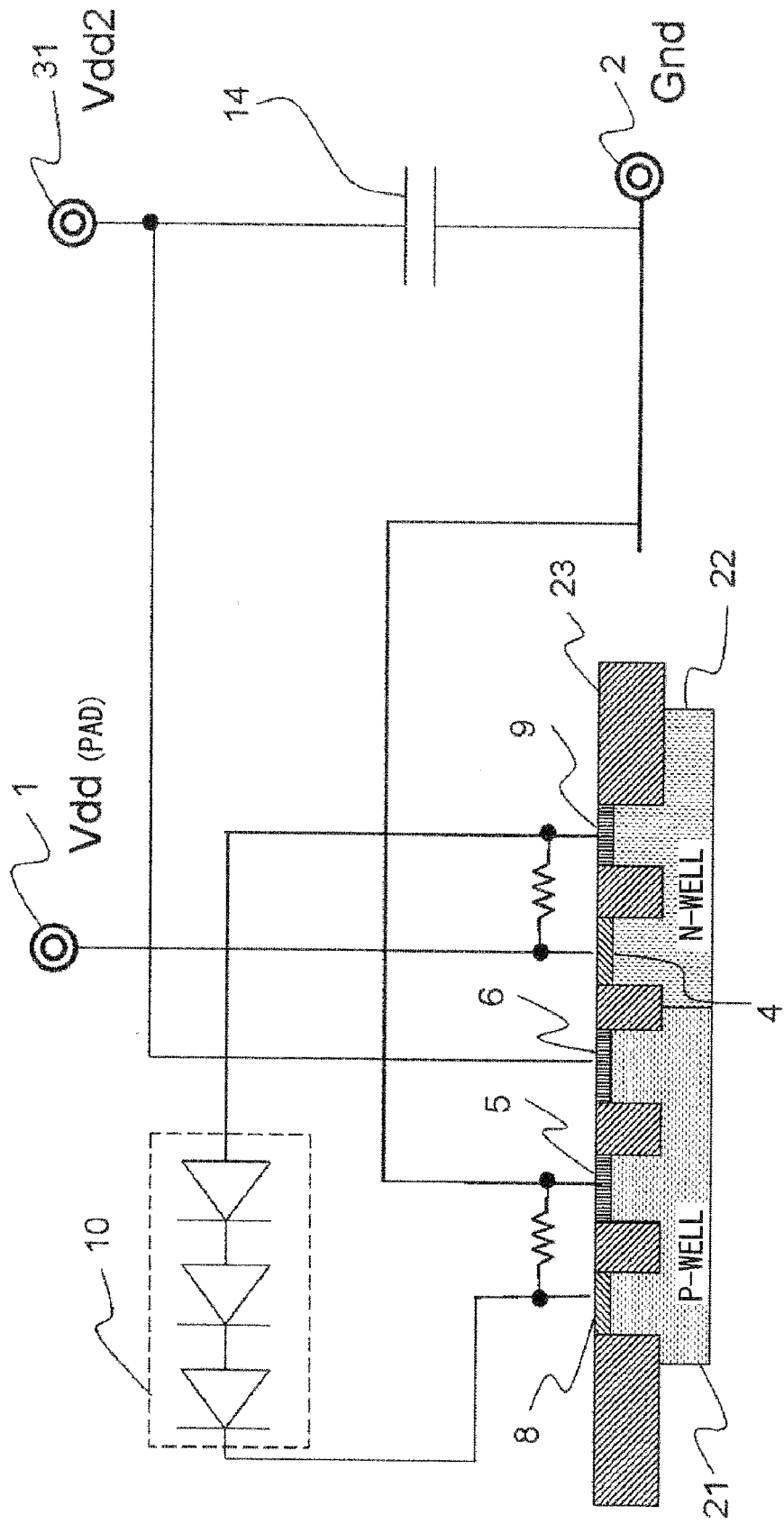
FIG. 9 shows an example of an internal circuit of a trigger element which is added to the cross-sectional view of FIG. 8.

Next, a third exemplary embodiment of the present invention will be described with reference to the drawings. The third exemplary embodiment shows an example of a protection circuit for use in protecting the power supply terminals, as in the first exemplary embodiment. FIG. 7 is a circuit diagram showing a circuit according to the third exemplary embodiment. FIG. 8 is a cross-sectional view showing the configuration of the circuit. FIG. 9 shows an example of an internal circuit of the trigger element 10 which is added to the cross-sectional view of FIG. 8, for facilitating the understanding of the circuit operation. In the third exemplary embodiment, components and operations identical to those of the first exemplary embodiment are denoted by the same reference numerals, and a description thereof is omitted.

First, the third exemplary embodiment shown in FIG. 7 is compared with the first exemplary embodiment shown in FIG. 2. While the capacitor element formed on the semiconductor substrate is used as the capacitor element 14 in the first exemplary embodiment, the emitter of the NPN transistor 11 is connected to a VDD2 terminal, which is another power supply terminal, and a parasitic capacitance between the VDD2 terminal and the GND terminal is used as a capacitor element in the third exemplary embodiment. Even when the emitter of the NPN transistor 11 is connected to the VDD2 terminal, the NPN transistor 11 is not rendered conductive during normal use, and thus no problem is posed in practical use. According to the third exemplary embodiment, the parasitic capacitance between the power supply terminals, which is inevitably formed because of the structure of the integrated circuit, is used as the capacitor element, to thereby realize a capacitor element having a large capacity, without increasing an area of a semiconductor chip. Note that, according to the third exemplary embodiment, if another capacitor is mounted on the outside of the semiconductor substrate between the VDD2 terminal and the GND terminal, the capacitance value can be increased.

Fourth Exemplary Embodiment

Figure 10:
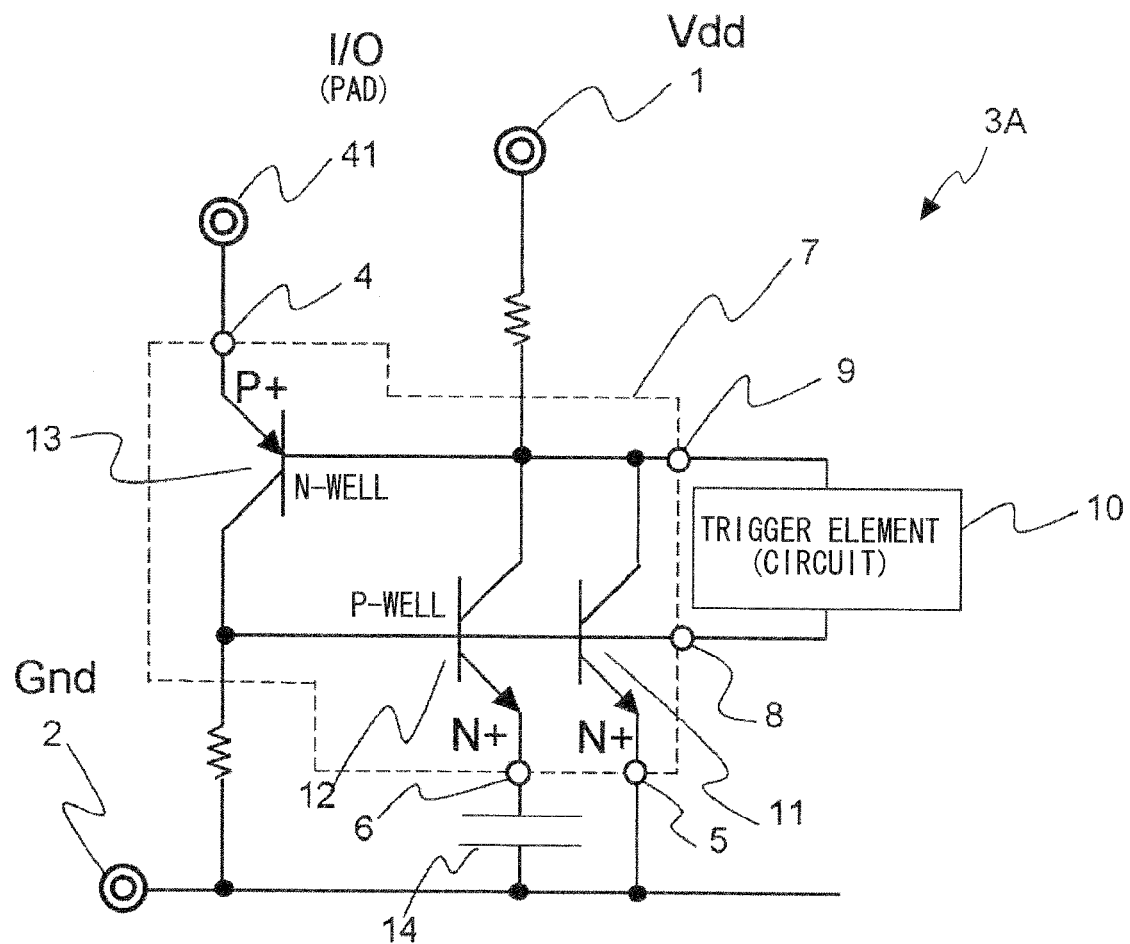
FIG. 10 is a circuit diagram showing a circuit according to a fourth exemplary embodiment of the present invention.
Figure 11:
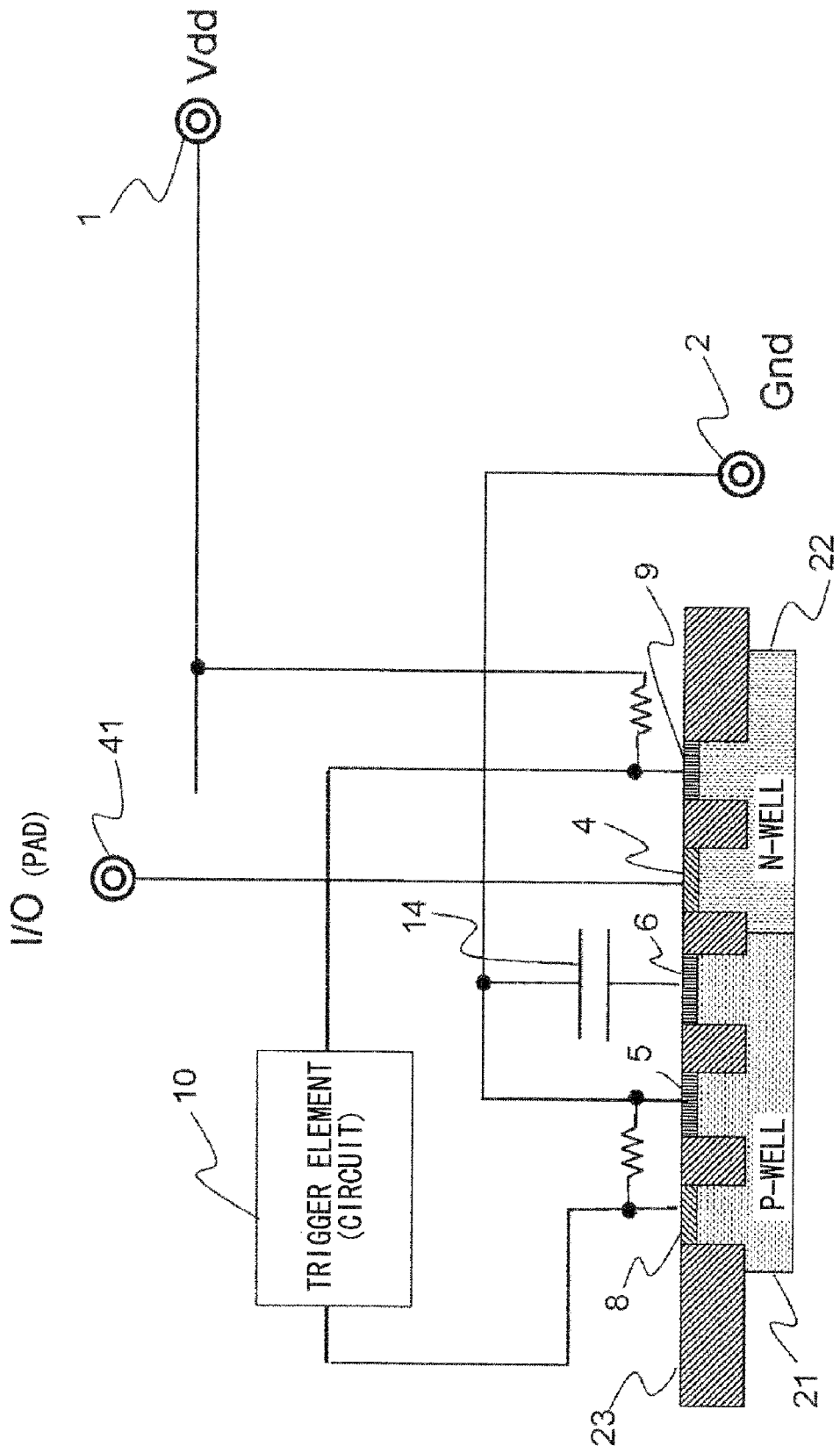
FIG. 11 is a cross-sectional view showing a multi-cathode thyristor according to the fourth exemplary embodiment of the present invention.
Figure 12:
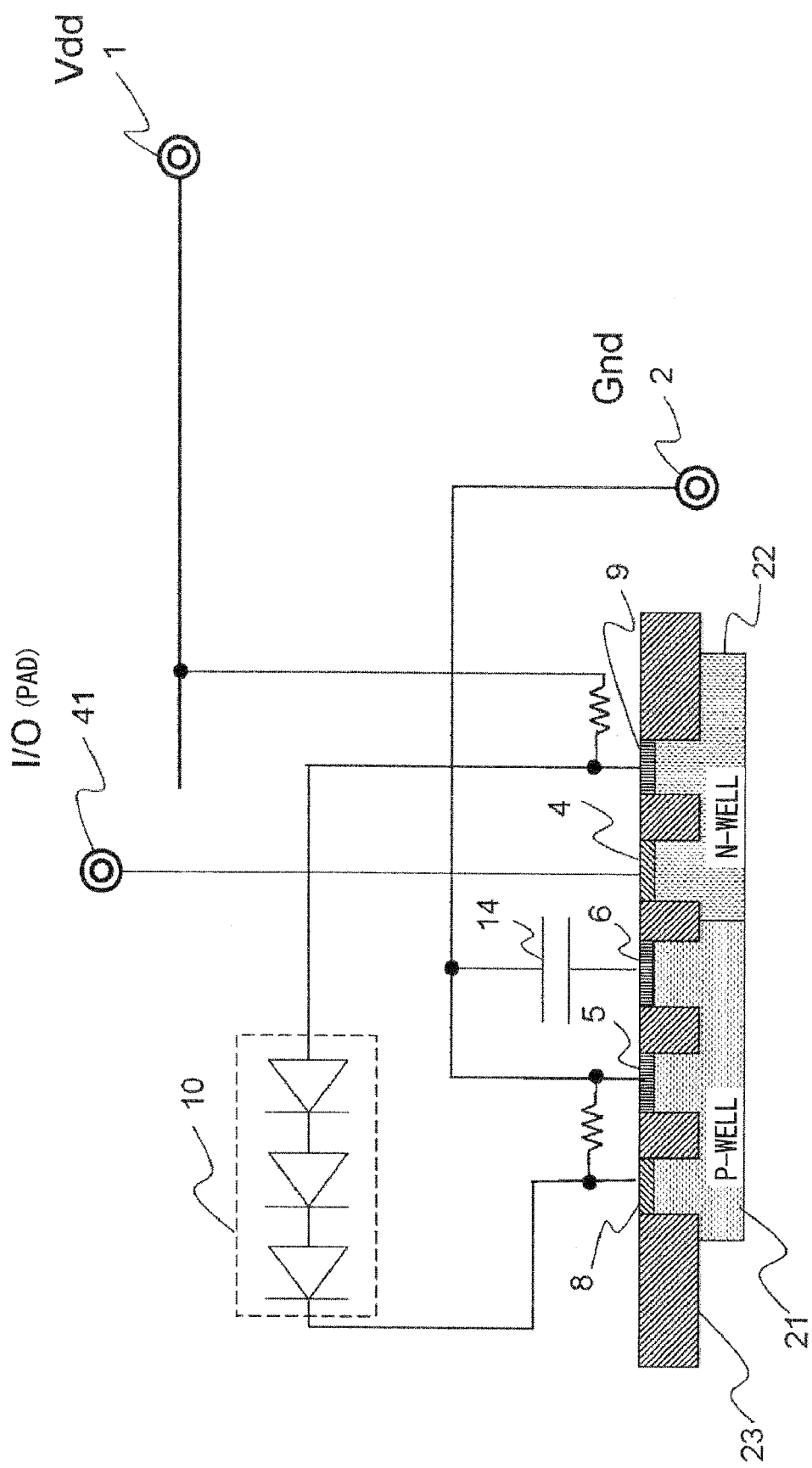
FIG. 12 shows an example of an internal circuit of a trigger element which is added to the cross-sectional view of FIG. 11.

Next, a fourth exemplary embodiment of the present invention shows an example in which the circuit according to the first exemplary embodiment is used to protect an input/output terminal. FIG. 10 is a circuit diagram of the circuit according to the fourth exemplary embodiment. FIG. 11 is a cross-sectional view showing a multi-cathode thyristor according to the fourth exemplary embodiment that is formed on a semiconductor substrate. FIG. 12 shows an example of an internal circuit of the trigger element 10 which is added to the cross-sectional view of FIG. 11, for facilitating the understanding of the circuit operation. Comparing FIG. 2 with FIG. 10, while the anode 4 of the multi-cathode thyristor 7 is connected to the VDD power supply terminal in the first exemplary embodiment, the anode 4 of the multi-cathode thyristor 7 is connected to an input/output terminal 41 in the fourth exemplary embodiment. A protection circuit 3A is provided between the input/output terminal 41 and the GND terminal 2, and is used to protect the input/output terminal 41 and the GND terminal 2. Further, the N-type trigger tap 9 is connected to the VDD terminal 1 through a resistor.

Note that examples of the input/output terminal 41 may include a terminal having both an input function and an output function, an input-only terminal, and an output-only terminal. That is, the protection circuit incorporating the multi-cathode thyristor can be used not only for protecting the power supply terminals, but also for protecting the input/output terminal.

Fifth Exemplary Embodiment

Figure 13:
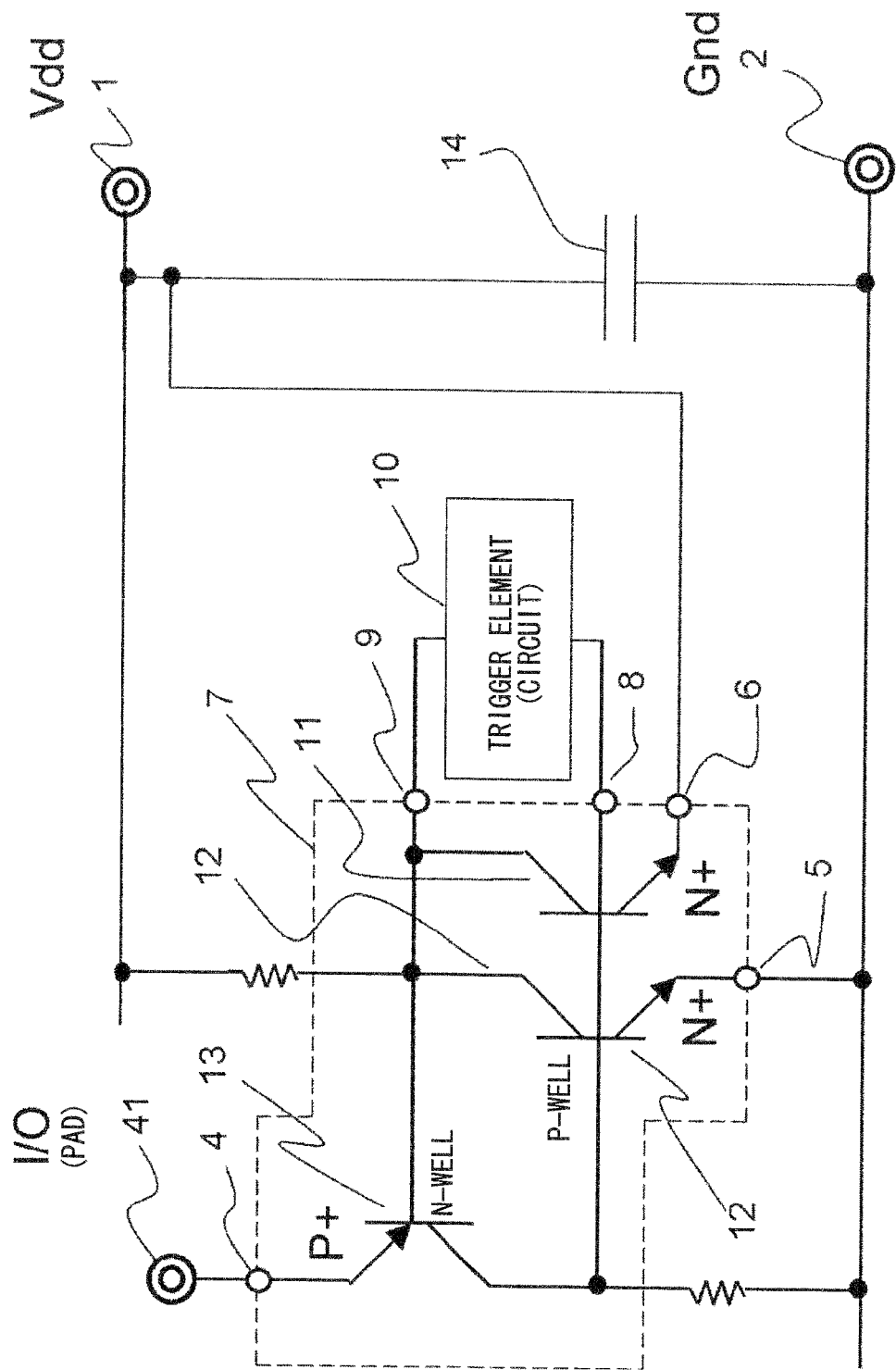
FIG. 13 is a circuit diagram showing a circuit according to a fifth exemplary embodiment of the present invention.
Figure 14:
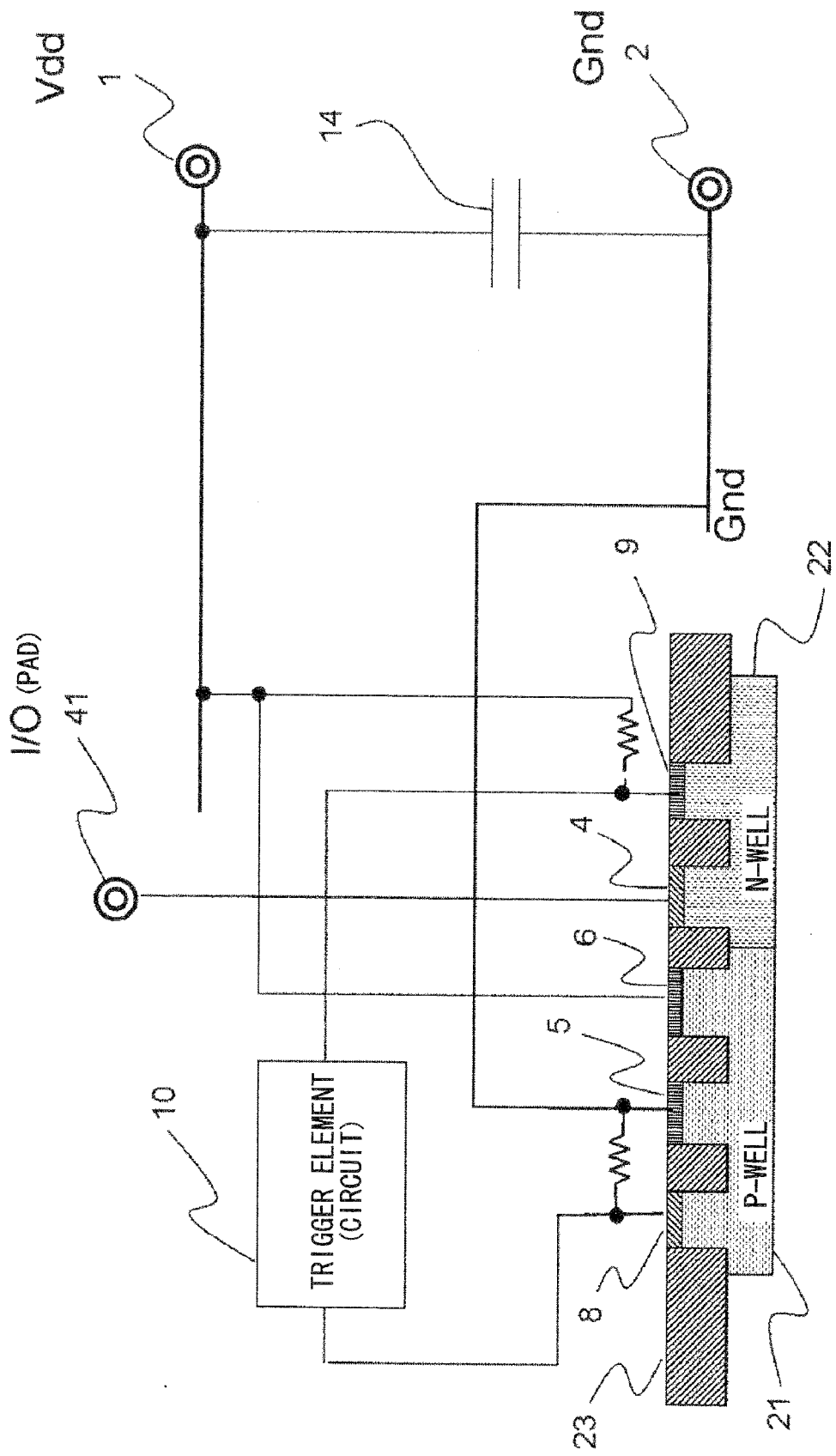
FIG. 14 is a cross-sectional view showing a multi-cathode thyristor according to the fifth exemplary embodiment of the present invention.
Figure 15:
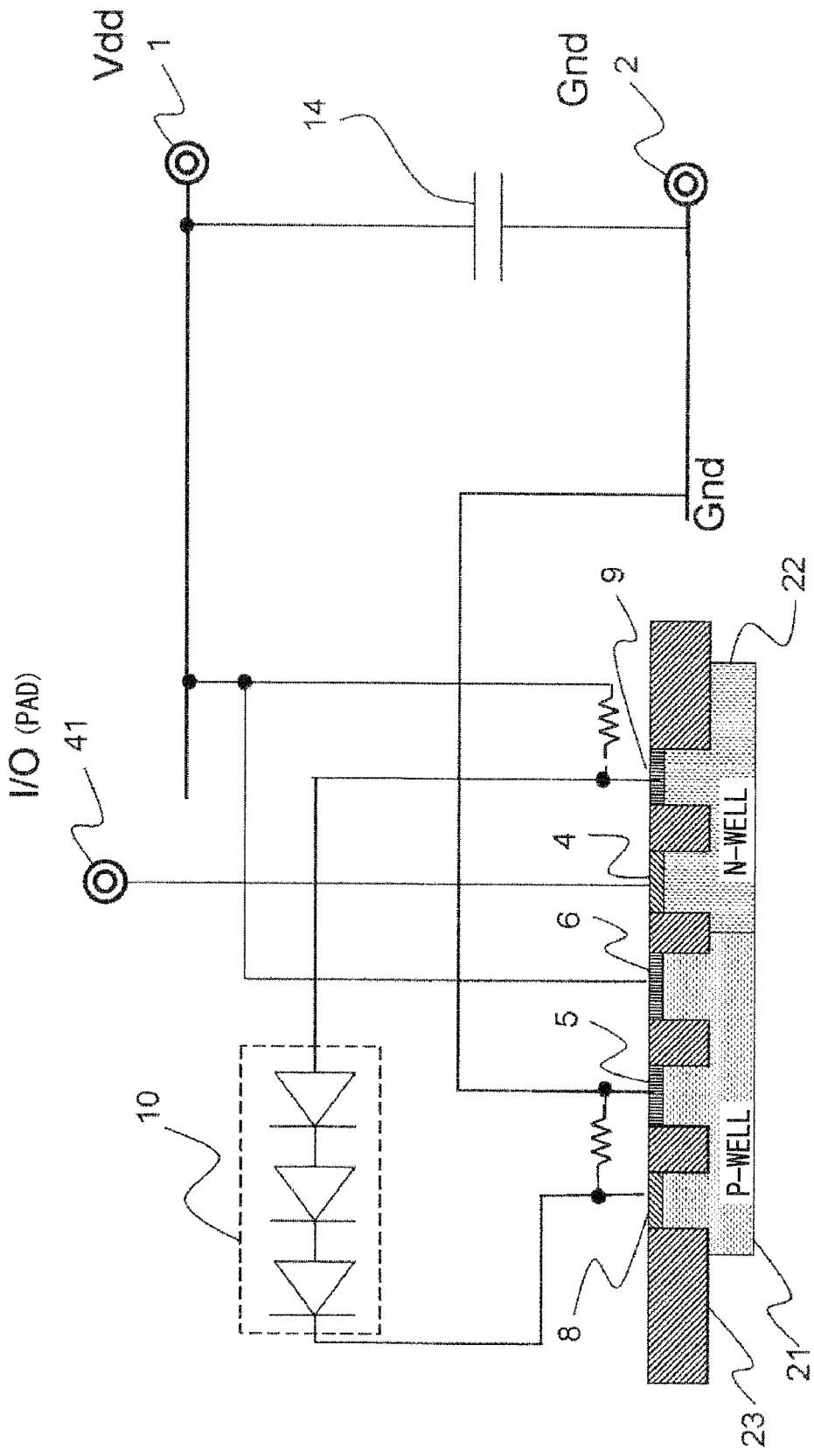
FIG. 15 shows an example of an internal circuit of a trigger element which is added to the cross-sectional view of FIG. 14.

Next, a fifth exemplary embodiment of the present invention shows an example in which the parasitic capacitance between the power supply terminals is used to protect the input/output terminal. FIG. 13 shows a circuit diagram of a circuit according to the fifth exemplary embodiment. FIG. 14 shows a cross-sectional view of the circuit. FIG. 15 shows an example of an internal circuit of the trigger element 10 which is added to the cross-sectional view of FIG. 14, for facilitating the understanding of the circuit operation. Comparing the fifth exemplary embodiment with the fourth exemplary embodiment, a parasitic capacitance between the power supply terminals is used as the capacitor element 14 in the fifth exemplary embodiment, which enables an increase in capacity without increasing the chip area in the protection circuit for protecting the input/output terminal.

Sixth Exemplary Embodiment

Figure 16:
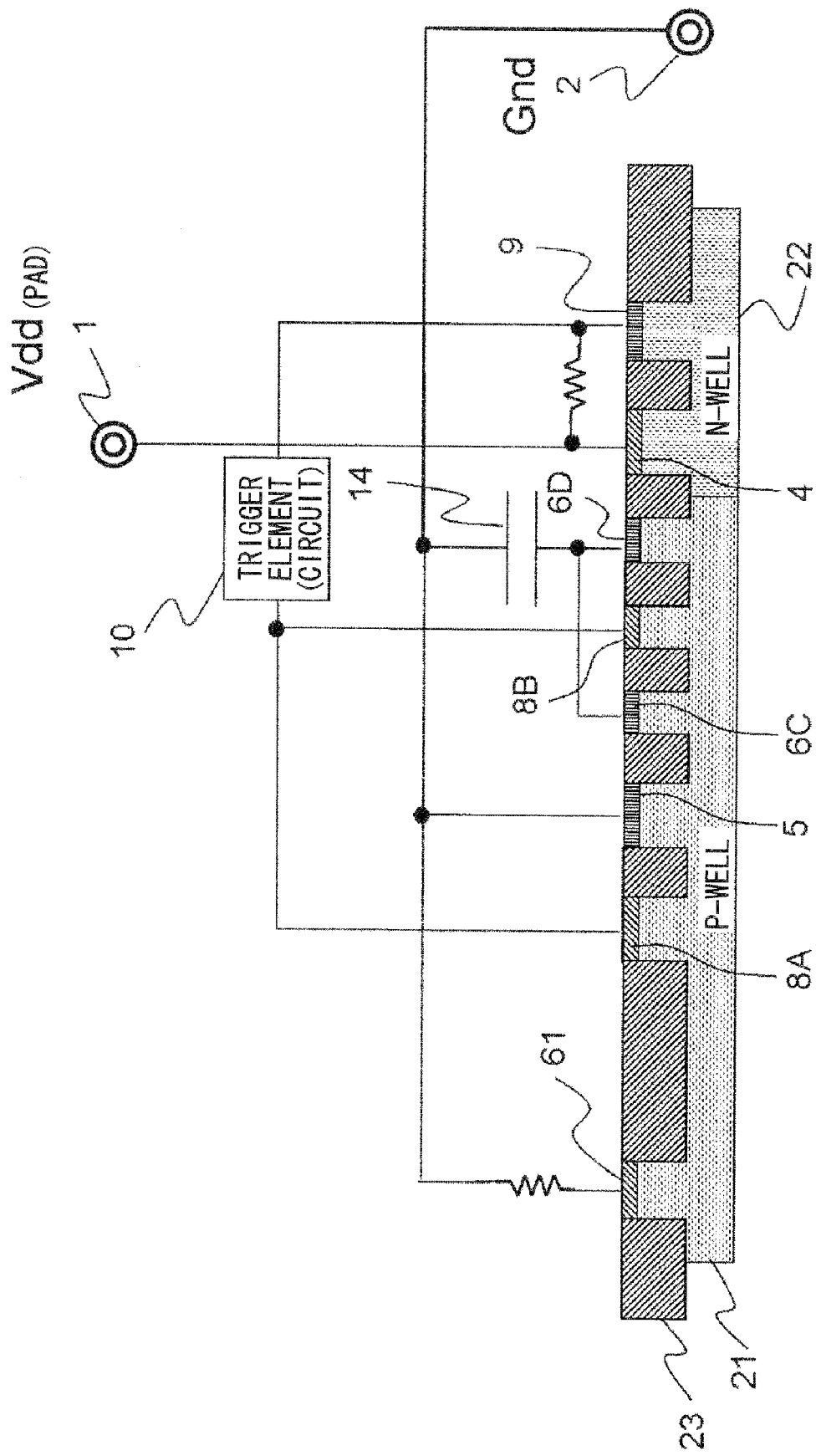
FIG. 16 is a cross-sectional view showing a multi-cathode thyristor according to a sixth exemplary embodiment of the present invention.
Figure 17:
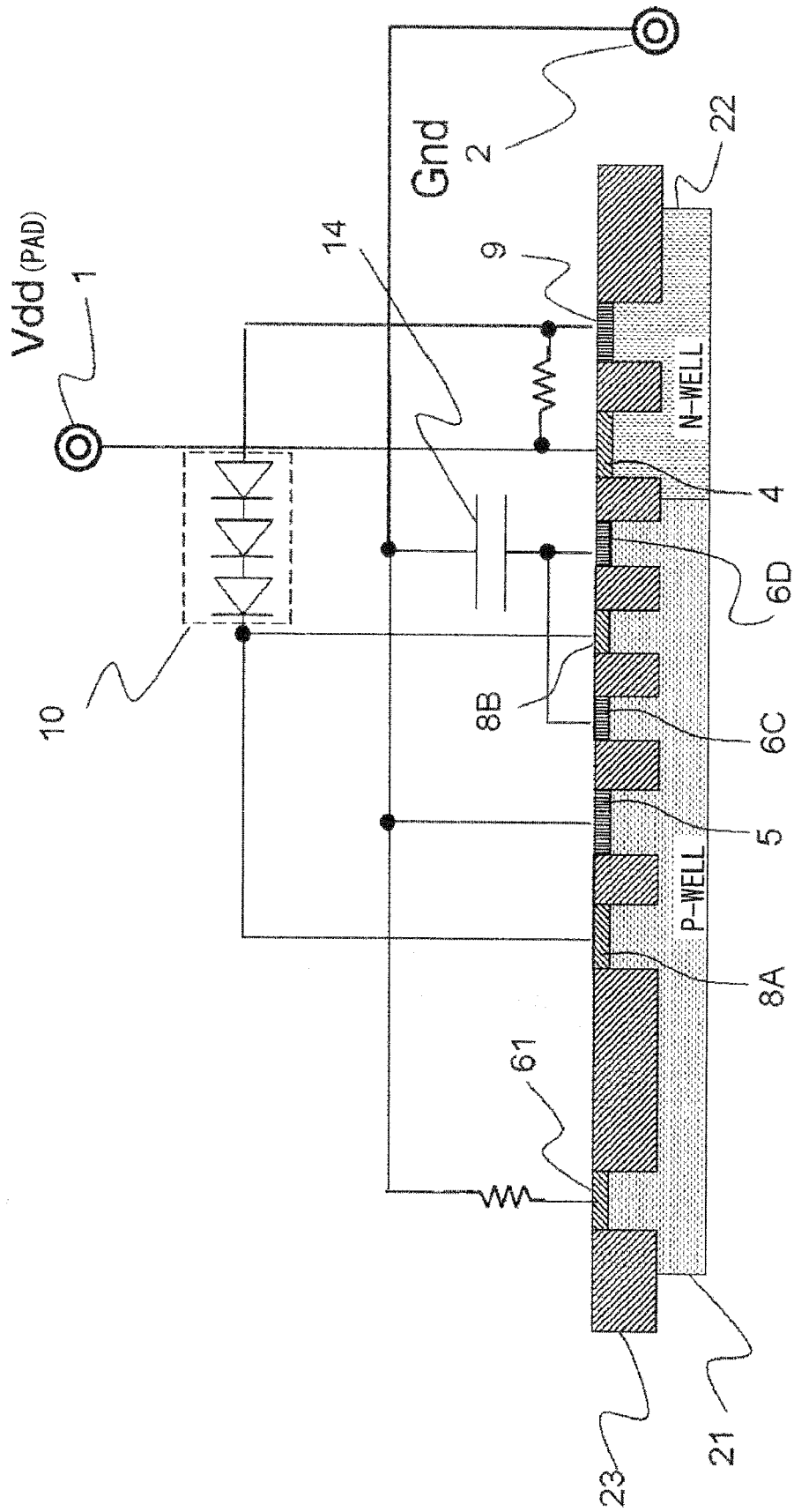
FIG. 17 shows an example of an internal circuit of a trigger element which is added to the cross-sectional view of FIG. 16.

Next, a sixth exemplary embodiment of the present invention shows an example in which the number of trigger taps of the multi-cathode thyristor is increased for the protection circuit that protects the power supply terminals according to the first exemplary embodiment to be triggered more easily. A circuit according to the sixth exemplary embodiment has the same configuration as that of the circuit according to the first exemplary embodiment of FIG. 2. FIG. 16 is a cross-sectional view showing a multi-cathode thyristor according to the sixth exemplary embodiment. FIG. 17 shows an example of an internal circuit of the trigger element 10 which is added to the cross-sectional view of FIG. 16, for facilitating the understanding of the circuit operation. Comparing the sixth exemplary embodiment shown in FIG. 16 with the first exemplary embodiment shown in the cross-sectional view of FIG. 3, while the number of the P-type trigger taps 8 of the P-well 21 is one and the trigger tap 8 is disposed outside the first cathode 5 in FIG. 3, a P-type trigger tap 8B is disposed in the vicinity of the second cathode in addition to a trigger tap 8A so that second cathodes 6C and 6D and the anode 4 can be rapidly triggered in FIG. 16. Particularly in this exemplary embodiment, two nodes are provided to the second cathodes 6C and 6D, and the P-type trigger tap 8B is disposed between the two second cathodes 6C and 6D.

In the above configuration, the trigger tap can be disposed nearest to the second cathode to thereby trigger the thyristor rapidly without increasing the distance between the second cathode and the anode when the trigger tap is disposed. Specifically, when not only the tap formed on the outside the first cathode but also the P-type tap is additionally formed in the vicinity of the second cathode, holes are injected into the vicinity of the cathode with a low resistance. That is, when a first-conductivity-type high-concentration region (P-type trigger tap 8B) connected to one end of the trigger element is formed inside the first cathode 5; the thyristor operation according to the sixth exemplary embodiment can be performed more rapidly than that according to the first exemplary embodiment. Further, a P-well tap 61 is spaced apart from each of the anode, the cathode, and the trigger tap so that the thyristor operation easily occurs.

Seventh Exemplary Embodiment

Figure 18:
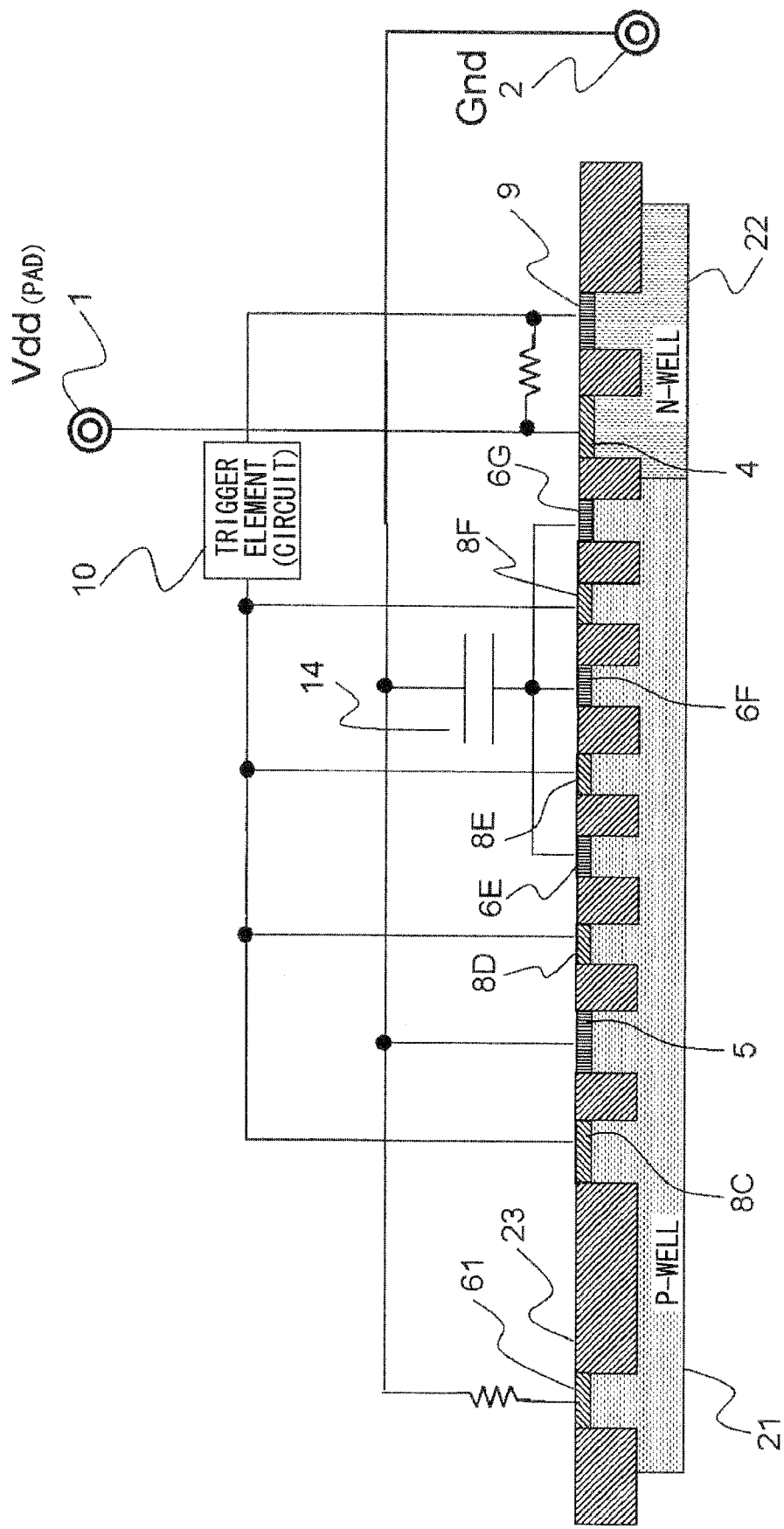
FIG. 18 is a cross-sectional view showing a multi-cathode thyristor according to a seventh exemplary embodiment of the present invention.
Figure 19:
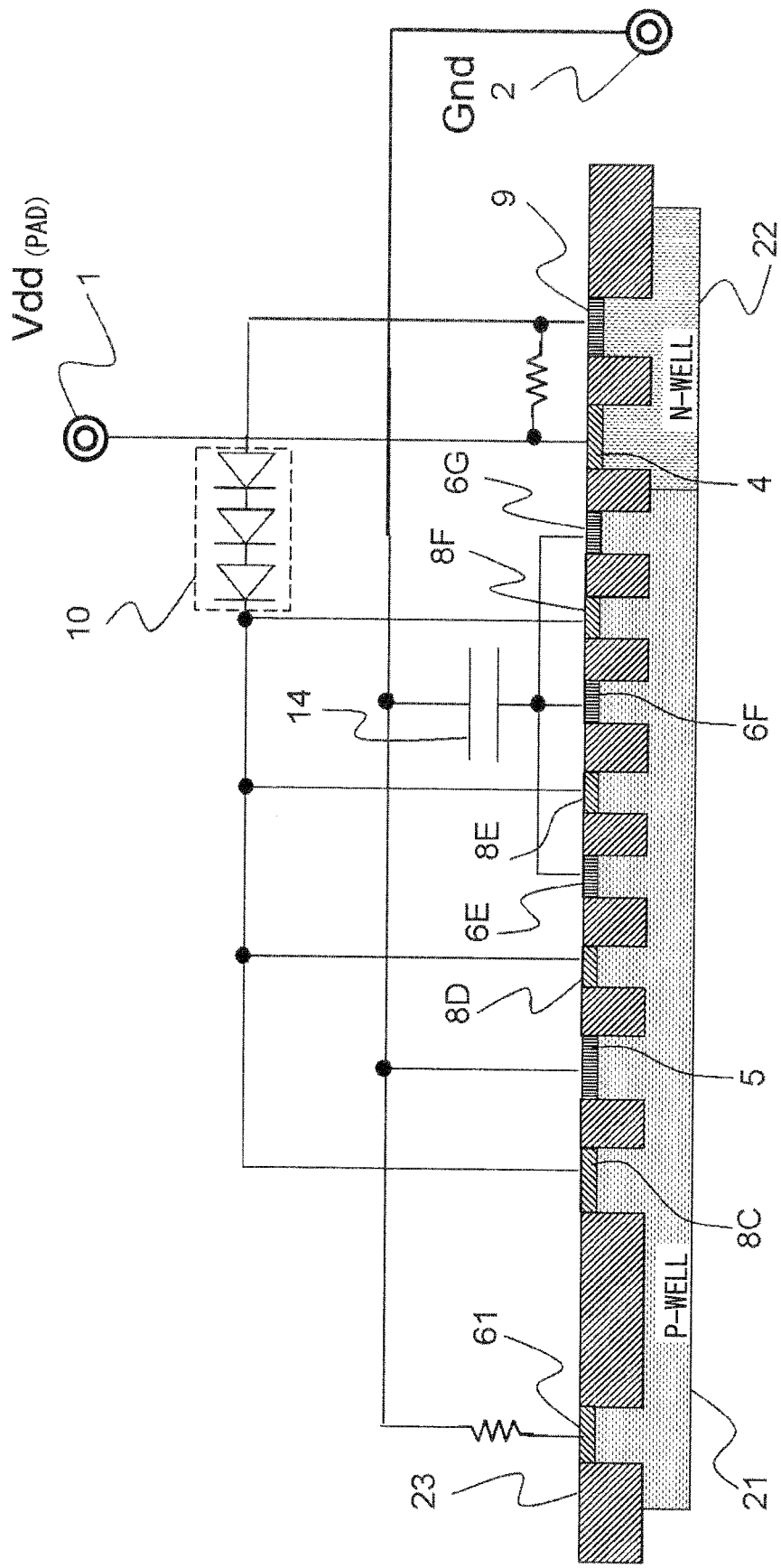
FIG. 19 shows an example of an internal circuit of a trigger element which is added to the cross-sectional view of FIG. 18.

Next, a seventh exemplary embodiment of the present invention will be described. FIG. 18 is a cross-sectional view of a multi-cathode thyristor according to the seventh exemplary embodiment. FIG. 19 shows an example of an internal circuit of the trigger element 10 which is added to the cross-sectional view of FIG. 18, for facilitating the understanding of the circuit operation. The circuit configuration according to the seventh exemplary embodiment is the same as the circuit diagram of the first exemplary embodiment shown in FIG. 2. The seventh exemplary embodiment is a modified example of the protection circuit that protects the power supply terminals, which is different from that of the sixth exemplary embodiment. According to the seventh exemplary embodiment, a trigger tap is provided also between the first cathode and the second cathode, to thereby rapidly trigger the thyristor operation between the anode, the second cathode, and the first cathode. Further, the number of the trigger taps provided in the vicinity of the second cathode and the number of the second cathodes are increased, thereby shortening the time required for the entirety of the second cathodes to be triggered. That is, also in this exemplary embodiment, first-conductivity-type high-concentration regions 8D, 8E, and 8F each connected to one end of the trigger element are formed inside the first cathode 5.

Eighth Exemplary Embodiment

Figure 20:
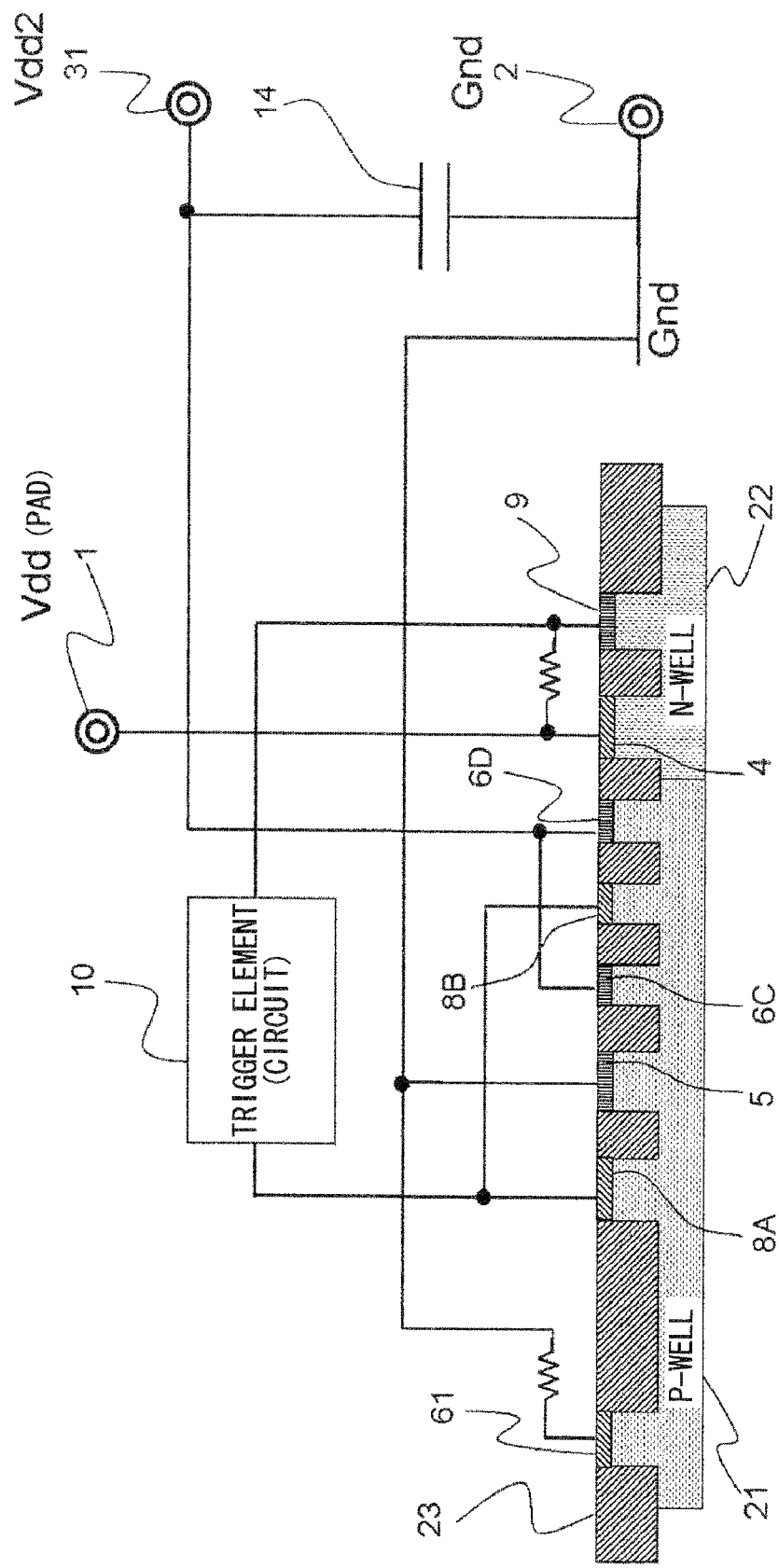
FIG. 20 is a cross-sectional view showing a multi-cathode thyristor according to an eighth exemplary embodiment of the present invention.
Figure 21:
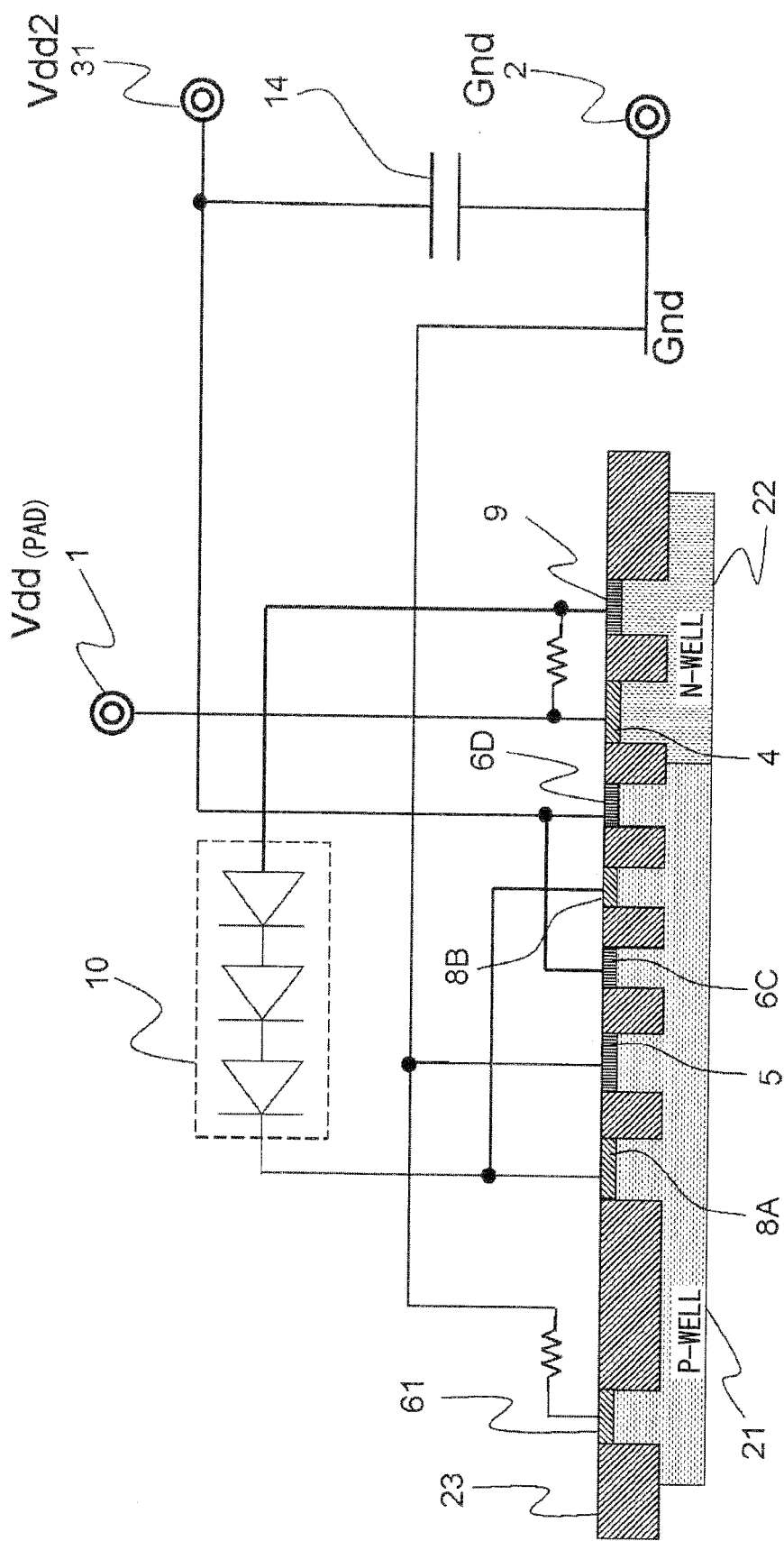
FIG. 21 shows an example of an internal circuit of a trigger element which is added to the cross-sectional view of FIG. 20.

Next, an eighth exemplary embodiment of the present invention will be described. FIG. 20 is a cross-sectional view of a cross-sectional view of a multi-cathode thyristor according to the eighth exemplary embodiment. FIG. 21 shows an example of an internal circuit of the trigger element 10 which is added to the cross-sectional view of FIG. 20, for facilitating the understanding of the circuit operation. The eighth exemplary embodiment is a modified example of the third exemplary embodiment in which the capacitance between the power supply terminals and the external capacitance are used for the protection circuit that protects the power supply terminals. Thus, the circuit configuration is the same as the circuit diagram of the third exemplary embodiment shown in FIG. 7. According to the eighth exemplary embodiment, the trigger taps are provided not only outside the first cathode but also in the vicinity of the second cathode, as in the sixth exemplary embodiment. According to the eighth exemplary embodiment, the P-type tap 8B is additionally provided in the vicinity of the second cathodes 6C and 6D in the circuit according to the third exemplary embodiment. As a result, holes are injected into the vicinity of the cathode with a low resistance, thereby speeding up the thyristor operation. That is, also in this exemplary embodiment, the first-conductivity-type high-concentration region (P-type trigger tap 8B) connected to one end of the trigger element is formed inside the first cathode 5.

Ninth Exemplary Embodiment

The sixth to eighth exemplary embodiments each show an example in which the trigger time for the protection circuit to protect the power supply terminals using the multi-cathode thyristor is shortened by devising the arrangement position of each of the trigger taps and cathodes. Also in the case of protecting the input/output terminal as described in the fourth exemplary embodiment, the trigger time can be shortened by devising the arrangement position of each of the trigger taps and cathodes, as in the case of protecting the power supply terminals. Hereinafter, a description is given of an example in which the trigger time for the protection circuit that protects the input/output terminal can be shortened by devising the arrangement position of each of the trigger taps and cathodes.

Figure 22:
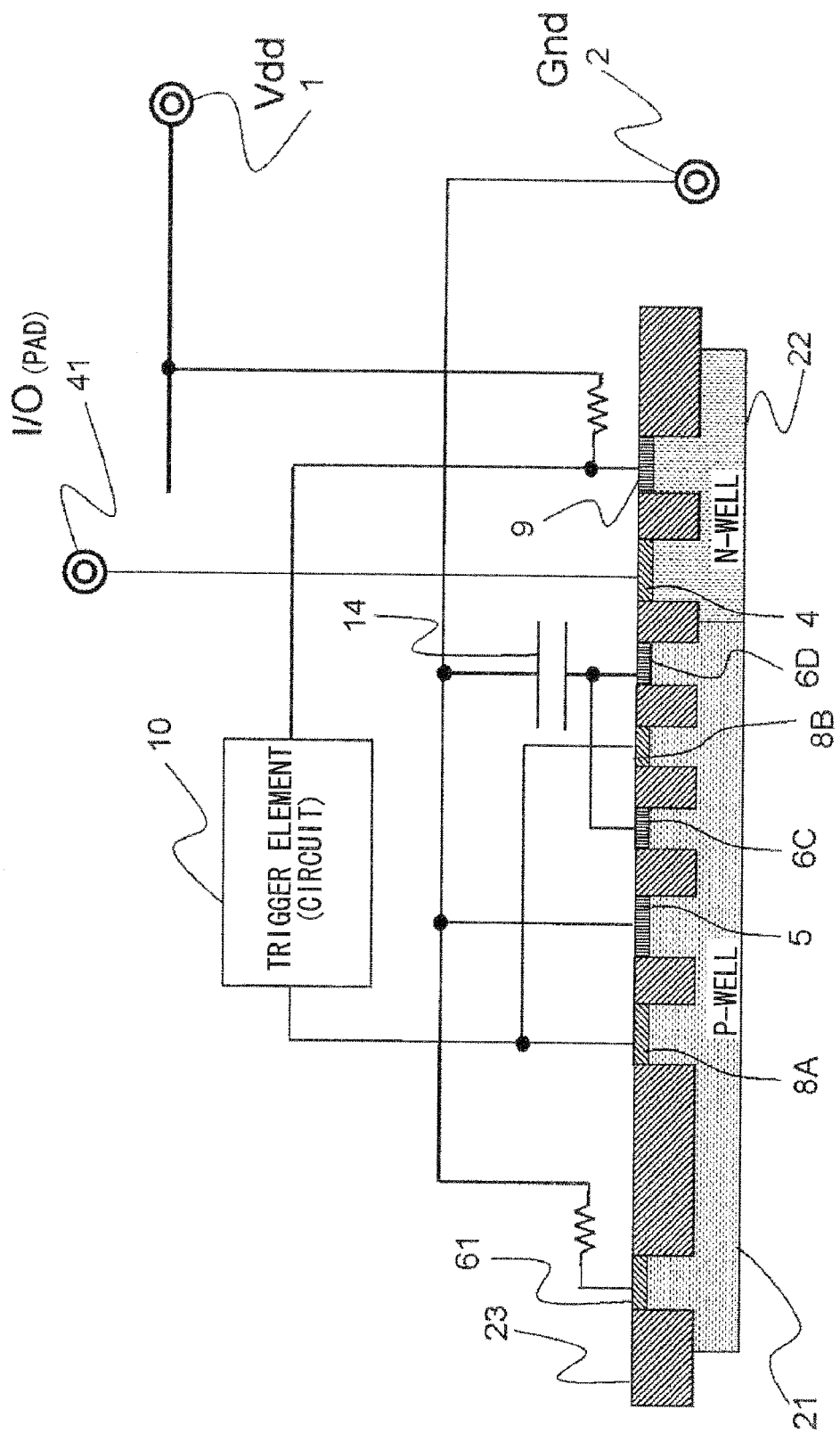
FIG. 22 is a cross-sectional view showing a multi-cathode thyristor according to a ninth exemplary embodiment of the present invention.
Figure 23:
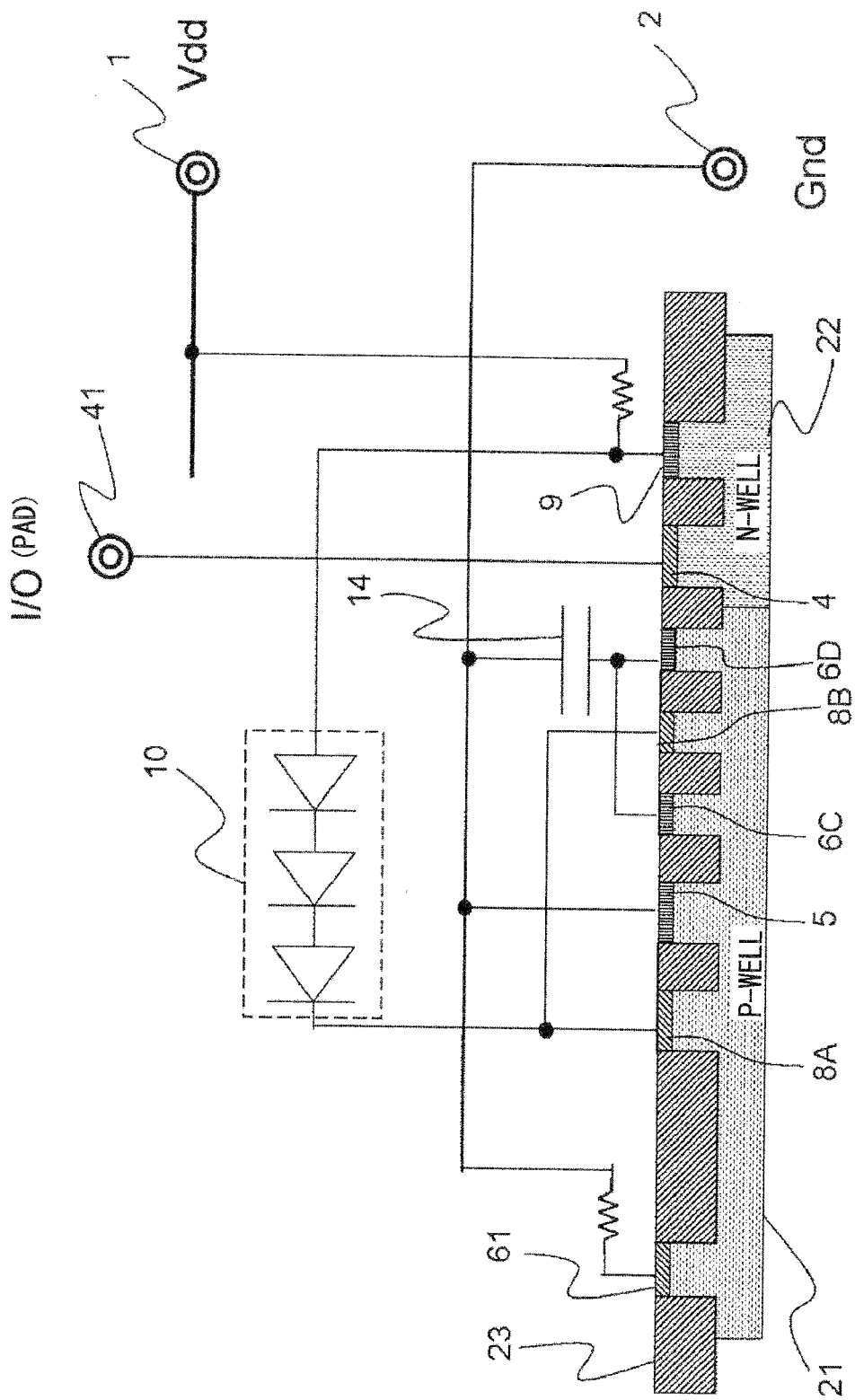
FIG. 23 shows an example of an internal circuit of a trigger element which is added to the cross-sectional view of FIG. 22.

FIG. 22 is a cross-sectional view of a multi-cathode thyristor according to a ninth exemplary embodiment of the present invention. FIG. 23 shows an example of an internal circuit of the trigger element 10 which is added to the cross-sectional view of FIG. 22, for facilitating the understanding of the circuit operation. The circuit according to the ninth exemplary embodiment has the same configuration as that of FIG. 10.

According to the ninth exemplary embodiment, the trigger time for the protection circuit that protects the input/output terminal using the multi-cathode thyristor is shortened by devising the arrangement position of each of the trigger taps and cathodes. Referring to FIG. 22, a P+ tap is additionally provided in the vicinity of the second cathode in the circuit of the fourth exemplary embodiment shown in FIG. 10. As a result, holes are injected into the vicinity of the cathode with a low resistance, thereby speeding up the thyristor operation. That is, also in this exemplary embodiment, the first-conductivity-type high-concentration region (P-type trigger tap 8B) connected to one end of the trigger element is formed inside the first cathode 5.

Tenth Exemplary Embodiment

Next, a tenth exemplary embodiment of the present invention will be described. The tenth exemplary embodiment shows an example in which the trigger operation is speeded up by devising the arrangement position of each of the cathodes and the P-type trigger taps in the circuit of the fifth exemplary embodiment in which the input/output terminal is protected using the parasitic capacitance between the power supply terminals.

Figure 24:
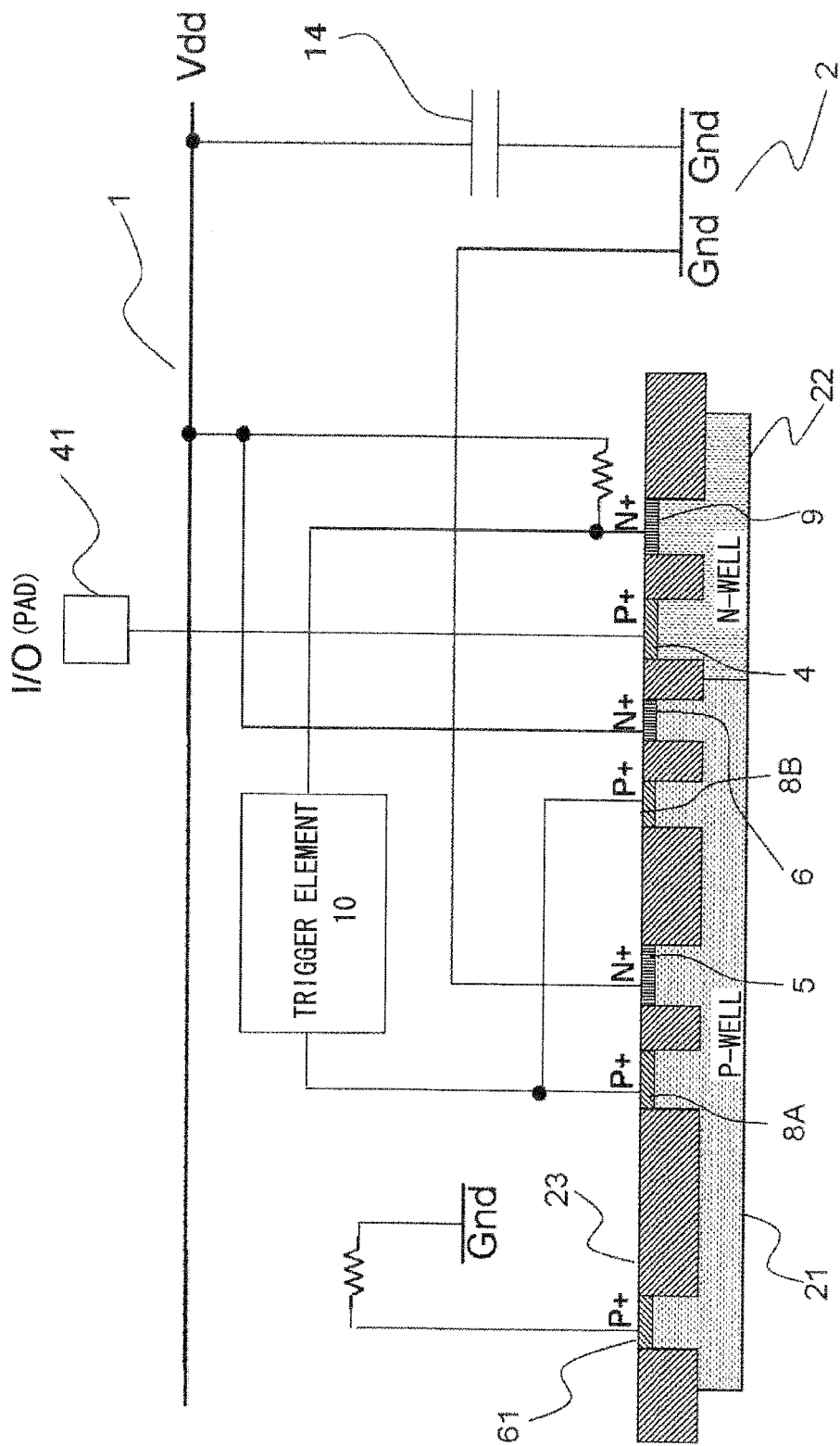
FIG. 24 is a cross-sectional view showing a multi-cathode thyristor according to a tenth exemplary embodiment of the present invention.
Figure 25:
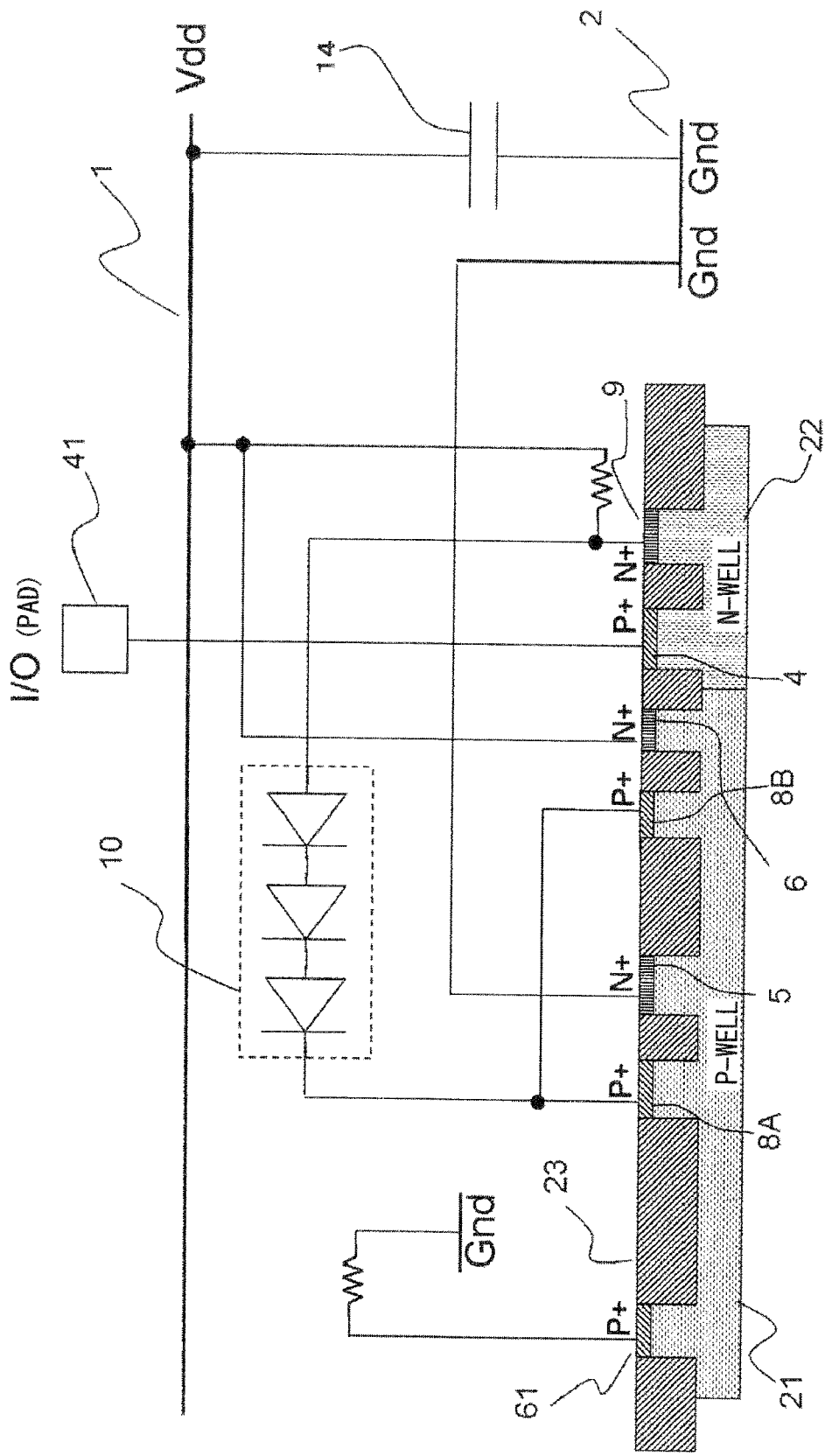
FIG. 25 shows an example of an internal circuit of a trigger element which is added to the cross-sectional view of FIG. 24.

FIG. 24 is a cross-sectional view of a multi-cathode thyristor for use in a protection circuit according to the tenth exemplary embodiment. FIG. 25 shows an example of an internal circuit of the trigger element 10 which is added to the cross-sectional view of FIG. 24, for facilitating the understanding of the circuit operation. The circuit according to the tenth exemplary embodiment has the same configuration as that of FIG. 13. Referring to FIG. 24, another P-type trigger tap 8B is provided between the first cathode 5 and the second cathode 6, in addition to the P-type trigger tap 8A provided outside the first cathode 5, in the circuit of the fifth exemplary embodiment shown in FIG. 14. While the anode 4 and the second cathode 6 are sandwiched between the N-type trigger tap 9 and the P-type trigger tap 8B, the N-type trigger tap 9 and the P-type trigger tap 8B are disposed relatively close to each other. Further, the second cathode 6 and the P-type trigger tap 8B is sandwiched between the first cathode 5 and the anode, and the first cathode 5 is disposed at a certain distance from the anode 4. Furthermore, the P-well tap 61 is spaced apart from the first cathode and the P-type trigger tap 8A and is further spaced apart from the anode 4.

In the above configuration, the N-type trigger tap 9 and the P-type trigger tap 8B are located adjacent to each other with the anode 4 and the second cathode 5 interposed therebetween. In addition, the P-well tap 61 is spaced apart from the anode 4 and the second cathode 6. Accordingly, when a current flows to the trigger element 10, holes and electrons are injected into a portion immediately below the anode 4 and the second cathode 6. As a result, the thyristor operation can be quickly started between the anode 4 and the second cathode 6. That is, also in this exemplary embodiment, the first-conductivity-type high-concentration region (P-type trigger tap 8B) connected to one end of the trigger element is formed inside the first cathode 5.

Further, since the anode 4 and the first cathode 5 are disposed at a certain distance from each other, a latch-up operation hardly occurs.

Eleventh Exemplary Embodiment

Next, an eleventh exemplary embodiment of the present invention will be described. The first to tenth exemplary embodiments each show an example of the protection circuit incorporating the multi-cathode thyristor. Alternatively, the present invention can also be applied to a protection circuit incorporating a multi-anode thyristor.

Figure 26:
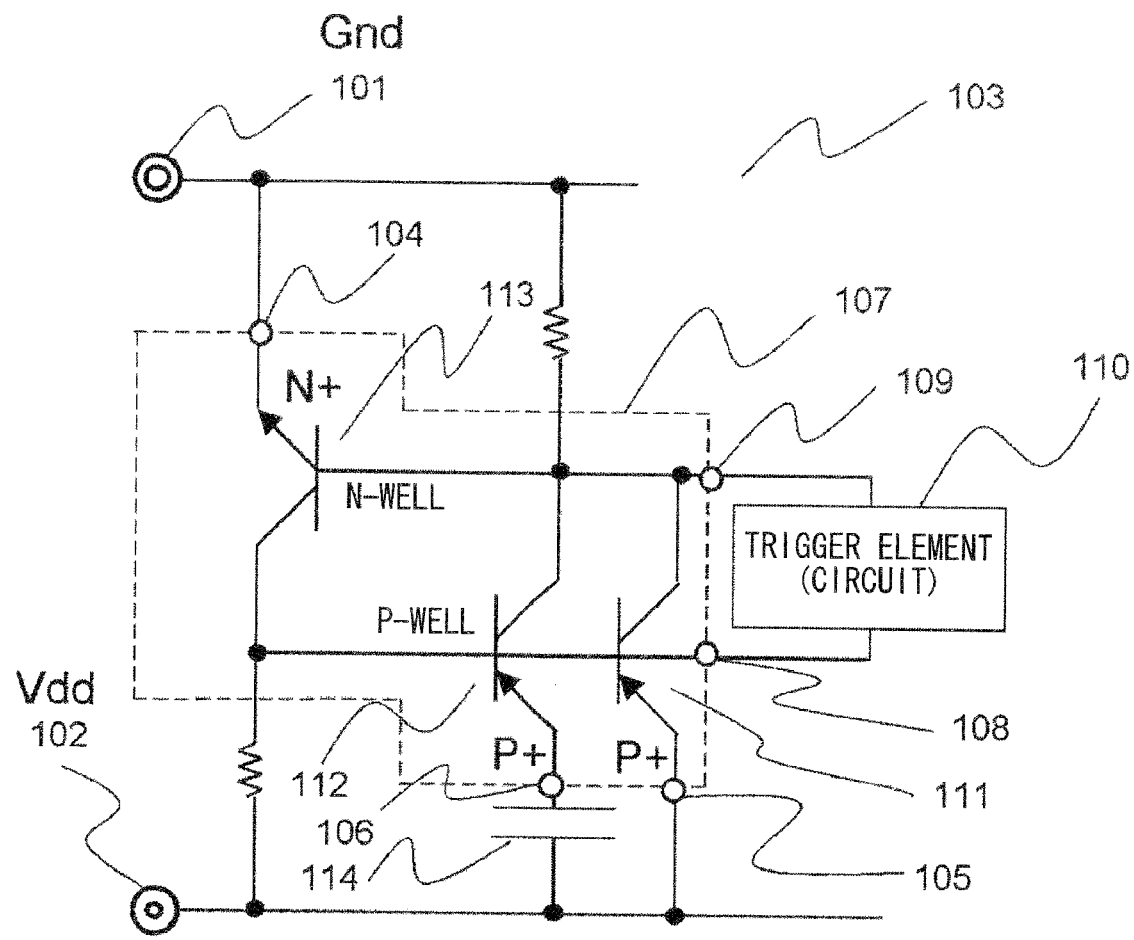
FIG. 26 is a circuit diagram showing a circuit according to an eleventh exemplary embodiment of the present invention.
Figure 27:
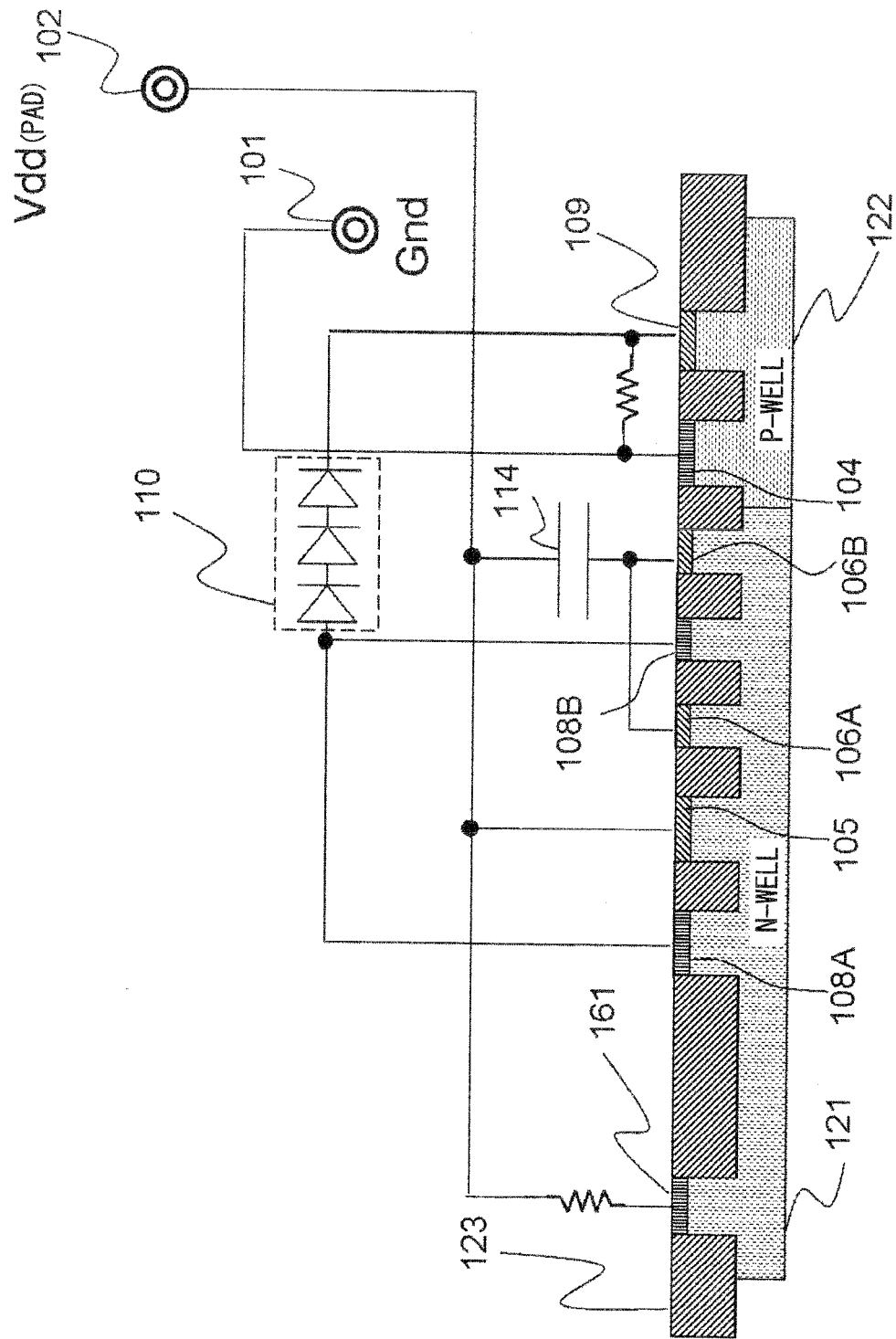
FIG. 27 is a cross-sectional view showing a multi-anode thyristor according to the eleventh exemplary embodiment of the present invention.
Figure 28:
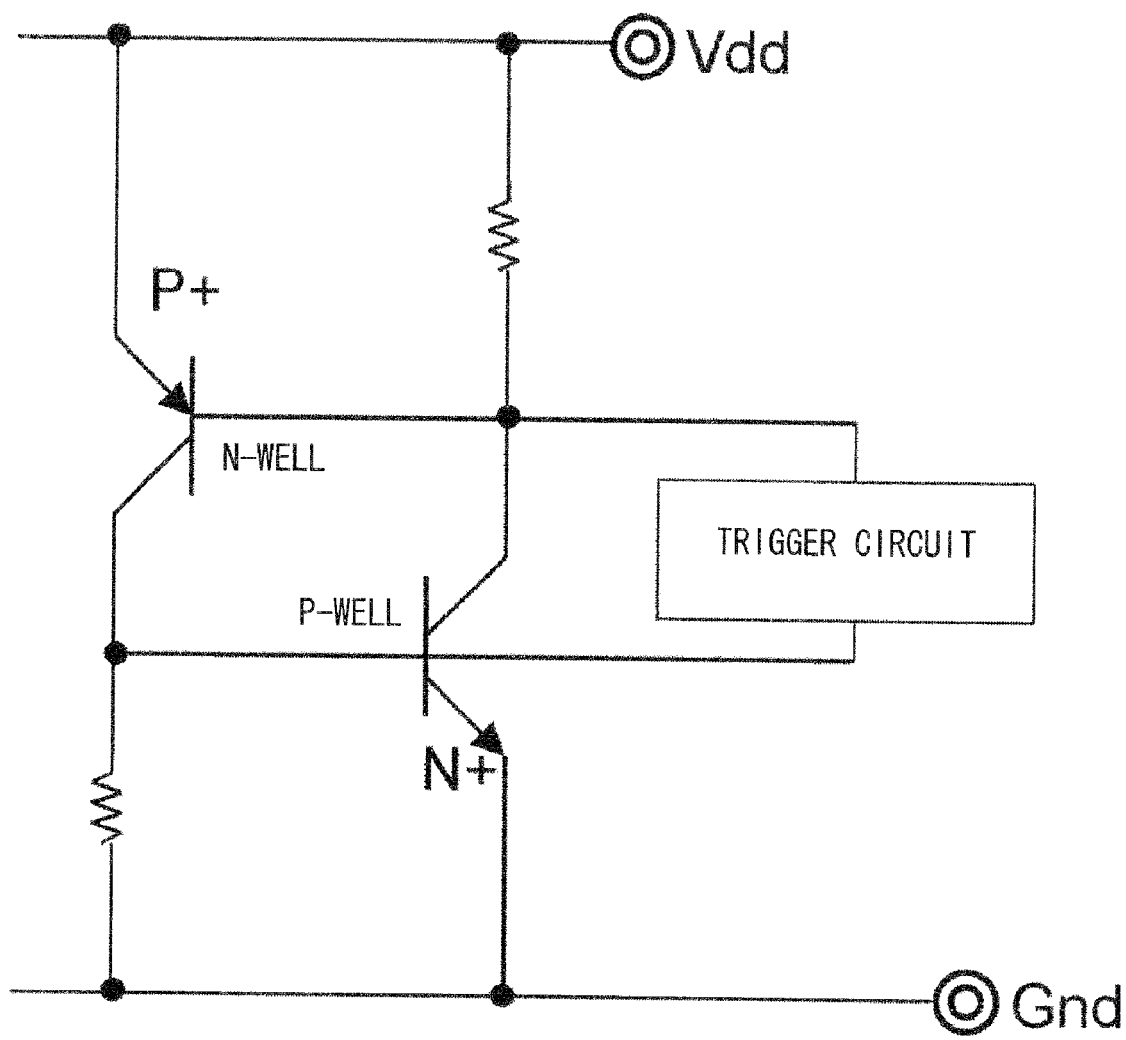
FIG. 28 is a circuit diagram showing a protection circuit according to a related art.
Figure 29:
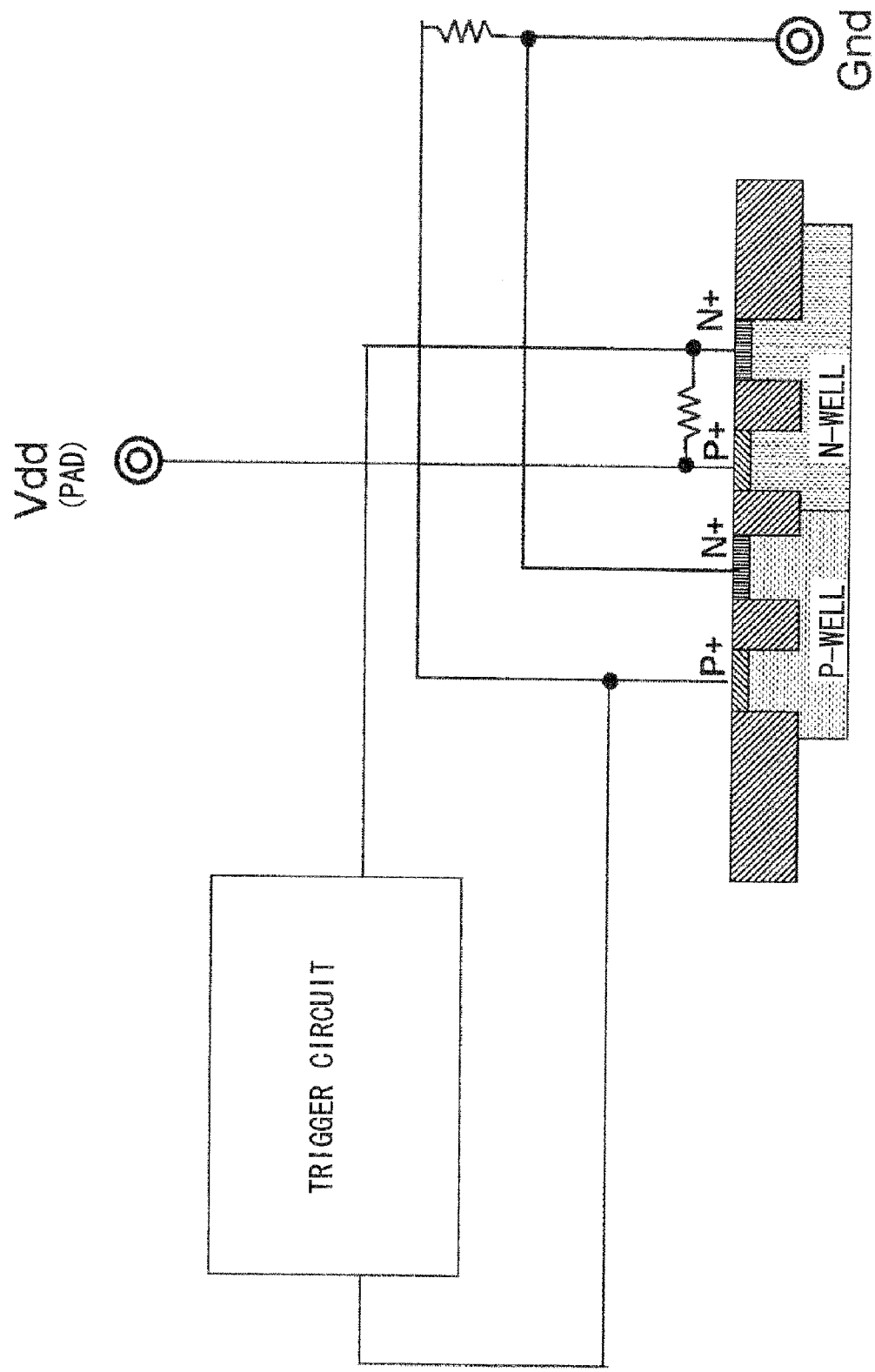
FIG. 29 is a cross-sectional view showing the protection circuit shown in FIG. 28.
Figure 30:
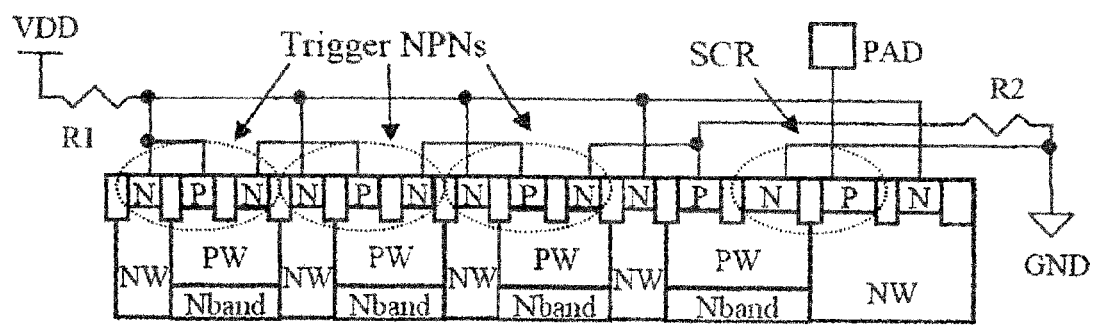
FIG. 30 is a cross-sectional view showing a protection circuit according to another related art.
Figure 31:
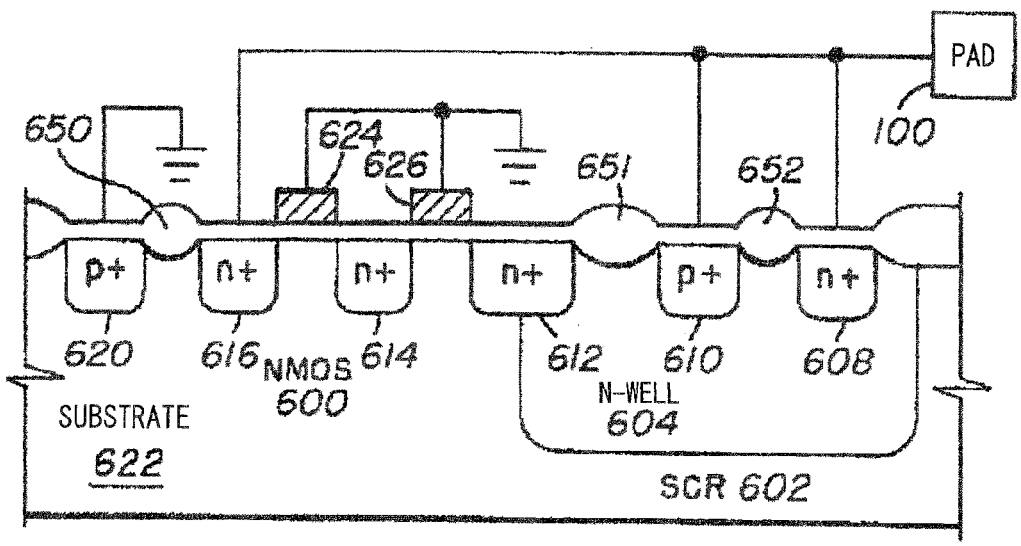
FIG. 31 is a circuit diagram showing a protection circuit according to still another related art.

The eleventh exemplary embodiment shows an example in which the multi-cathode thyristor for the protection circuit that protects the power supply terminals according to the sixth exemplary embodiment is replaced with a multi-anode thyristor, and the VDD terminal and the GND terminal are reversely connected. FIG. 26 is a circuit diagram of a circuit according to the eleventh exemplary embodiment. FIG. 27 is a cross-sectional view of the multi-anode thyristor for use in the protection circuit according to the eleventh exemplary embodiment.

Note that not only the eleventh exemplary embodiment but also the first to tenth exemplary embodiments can be applied to a protection circuit incorporating a multi-anode thyristor, by replacing the VDD terminal with the GND terminal, replacing the multi-cathode thyristor with the multi-anode thyristor, replacing the anode with the cathode, replacing the first cathode and the second cathode with a first anode and a second anode, replacing the VDD2 terminal with a GND2 terminal, and replacing a P-type conductivity type with an N-type conductivity type.

Moreover, the protection circuit incorporating the multi-cathode thyristor according to an exemplary embodiment of the present invention and the protection circuit incorporating the multi-anode thyristor according to an exemplary embodiment of the present invention are common in that the protection circuits serve as a protection circuit provided between a first terminal and a second terminal and including: a capacitor element having one end connected to the second terminal; and a thyristor formed on a semiconductor substrate and including: a first-conductivity-type low-concentration region; a second-conductivity-type low-concentration region formed to be adjacent to the first-conductivity-type low-concentration region; a first-conductivity-type high-concentration region formed in the second-conductivity-type low-concentration region and connected to the first terminal; a first second-conductivity-type high-concentration region formed in the first-conductivity-type low-concentration region and connected to the second terminal; and a second second-conductivity-type high-concentration region sandwiched between the first-conductivity-type high-concentration region and the first second-conductivity-type high-concentration region, formed in the first-conductivity-type low-concentration region, and connected to the other end of the capacitor element.

As easily understood from the above-mentioned exemplary embodiments, the second cathode (second anode) is not necessarily provided between the anode (cathode) and the first cathode (first anode), and the second cathode (second anode) may be disposed at any position where the second cathode (second anode) causes the thyristor operation more easily than the first cathode (first anode) and the thyristor operation between the first cathode (first anode) and the anode (cathode) is induced when the thyristor operation is started.

The present invention has been described in terms of exemplary embodiments, but the present invention is not limited to the structures of the above exemplary embodiments. Various modifications and changes can be made by those skilled in the art within the scope of the present invention.

The first to eleventh exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A protection circuit provided between a first terminal and a second terminal, the protection circuit comprising:
    a capacitor element having one end connected to the second terminal; and
    a multi-cathode thyristor formed on a semiconductor substrate, and including an anode connected to the first terminal, a first cathode connected to the second terminal, and a second cathode disposed between the anode and the first cathode and connected to another terminal of the capacitor element.

2. The protection circuit according to claim 1 further comprising a trigger element, wherein:
    the multi-cathode thyristor further includes:
        a first-conductivity-type low-concentration region;
        a second-conductivity-type low-concentration region formed to be adjacent to the first-conductivity-type low-concentration region;
        a first-conductivity-type high-concentration region formed in the first-conductivity-type low-concentration region and connected to an end of the trigger element; and
        a second-conductivity-type high-concentration region formed in the second-conductivity-type low-concentration region and connected to another end of the trigger element;
    the anode serves as a first-conductivity-type high-concentration region formed in the second-conductivity-type low-concentration region; and
    the first cathode and the second cathode serve as second-conductivity-type high-concentration regions formed in the first-conductivity-type low-concentration region.

3. The protection circuit according to claim 2, wherein the first-conductivity-type high-concentration region connected to the one end of the trigger element is disposed outside the first cathode, and the second-conductivity-type high-concentration region connected to the another end of the trigger element is disposed outside the anode.

4. The protection circuit according to claim 3, wherein the first-conductivity-type high-concentration region connected to the one end of the trigger element is formed also inside the first cathode.

5. The protection circuit according to claim 1, wherein a holding voltage for holding a thyristor operation of the multi-cathode thyristor is greater than a possible maximum potential difference between the first terminal and the second terminal in an ordinary use state.

6. The protection circuit according to claim 1, wherein each of the first terminal and the second terminal comprises a power supply terminal.

7. The protection circuit according to claim 1, wherein the first terminal comprises an input/output terminal, and the second terminal comprises a power supply terminal.

8. The protection circuit according to claim 1, wherein the multi-cathode thyristor is replaced with a multi-anode thyristor with the anode replaced with a cathode, the first cathode replaced with a first anode, and the second cathode replaced with a second anode.

9. A protection circuit provided between a first terminal and a second terminal, the protection circuit comprising:
- a capacitor element having one end connected to the second terminal; and
- a multi-cathode thyristor formed on a semiconductor substrate, and including an anode connected to the first terminal, a first cathode connected to the second terminal, and a second cathode connected to another end of the capacitor element,
- wherein the second cathode is disposed at a position where the second cathode causes a thyristor operation more easily than the first cathode and the thyristor operation between the first cathode and the anode is induced when the thyristor operation is started.

10. The protection circuit according to claim 9 further comprising a trigger element, wherein:
the multi-cathode thyristor further includes:
- a first-conductivity-type low-concentration region;
- a second-conductivity-type low-concentration region formed to be adjacent to the first-conductivity-type low-concentration region;
- a first-conductivity-type high-concentration region formed in the first-conductivity-type low-concentration region and connected to an end of the trigger element; and
- a second-conductivity-type high-concentration region formed in the second-conductivity-type low-concentration region and connected to another end of the trigger element;

the anode serves as a first-conductivity-type high-concentration region formed in the second-conductivity-type low-concentration region; and the first cathode and the second cathode serve as second-conductivity-type high-concentration regions formed in the first-conductivity-type low-concentration region.

11. A protection circuit provided between a first terminal and a second terminal, the protection circuit comprising:
- a capacitor element having one end connected to the second terminal; and
- a thyristor formed on a semiconductor substrate, the thyristor including:
  - a first-conductivity-type low-concentration region;
  - a second-conductivity-type low-concentration region formed to be adjacent to the first-conductivity-type low-concentration region;
  - a first-conductivity-type high-concentration region formed in the second-conductivity-type low-concentration region and connected to the first terminal;
  - a first second-conductivity-type high-concentration region formed in the first-conductivity-type low-concentration region and connected to the second terminal; and
  - a second second-conductivity-type high-concentration region sandwiched between the first-conductivity-type high-concentration region and the first second-conductivity-type high-concentration region, formed in the first-conductivity-type low-concentration region, and connected to another end of the capacitor element.

* * * * *